(12) United States Patent
Hormis et al.

(10) Patent No.: US 11,296,764 B2
(45) Date of Patent: Apr. 5, 2022

(54) BEAMFORMING REPEATERS WITH DIGITALLY ASSISTED INTERFERENCE MITIGATION

(71) Applicant: QUALCOMM Incorporated, San Diego, CA (US)

(72) Inventors: Raju Hormis, New York, NY (US); Junyi Li, Chester, NJ (US); Navid Abedini, Somerset, NJ (US); Juergen Cezanne, Ocean Township, NJ (US); Ozge Koymen, Princeton, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 150 days.

(21) Appl. No.: 16/867,801

(22) Filed: May 6, 2020

(65) Prior Publication Data
US 2020/0358501 A1 Nov. 12, 2020

Related U.S. Application Data

(60) Provisional application No. 62/845,074, filed on May 8, 2019.

(51) Int. Cl.
*H04B 7/06* (2006.01)
*H04W 56/00* (2009.01)
*H03H 17/00* (2006.01)

(52) U.S. Cl.
CPC .......... *H04B 7/0617* (2013.01); *H03H 17/00* (2013.01); *H04W 56/001* (2013.01); *H03H 2017/009* (2013.01); *H03H 2017/0081* (2013.01)

(58) Field of Classification Search
CPC .. H04B 7/0617; H04B 7/0695; H04B 7/0845; H04B 7/088; H04B 7/15528;
(Continued)

(56) References Cited

U.S. PATENT DOCUMENTS

| 6,934,511 | B1 | 8/2005 | Lovinggood et al. |
| 2015/0180568 | A1 | 6/2015 | Motoyoshi |

(Continued)

FOREIGN PATENT DOCUMENTS

EP 3068060 A1 9/2016

OTHER PUBLICATIONS

Partial International Search Report—PCT/US2020/031795—ISA/EPO—dated Jun. 30, 2020 (192410WO).

(Continued)

*Primary Examiner* — Fitwi Y Hailegiorgis
(74) *Attorney, Agent, or Firm* — Holland & Hart LLP

(57) ABSTRACT

Methods, systems, and devices for wireless communications are described that provide a repeater for beamforming a received signal at a millimeter wave (mmW) radio frequency via one or more scan angles or beamforming directions and then retransmitting and beamforming the signal at the mmW radio frequency. Repeaters may include analog and digital components for downconverting on the received signal to reduce a frequency of the signal from the mmW frequency to an intermediate frequency (IF) or baseband frequency, and then filtering the downconverted signal to reduce interference. The filtering may include digital filtering or a combination of analog and digital filtering, in which a set of filter coefficients for the digital filtering is selected based on beamforming parameters used to receive the signal, retransmit the signal, or both. The repeater may then upconvert the filtered signal back to the mmW frequency for the retransmission of the signal.

30 Claims, 19 Drawing Sheets

(58) Field of Classification Search
CPC ............... H04B 7/026; H03H 17/00; H03H 2017/0081; H03H 2017/009; H04W 56/001
USPC ........................................................ 370/329
See application file for complete search history.

(56) References Cited

U.S. PATENT DOCUMENTS

2016/0135191 A1    5/2016    Negus et al.
2019/0020401 A1*    1/2019    Gharavi ............. H04B 7/15528
2020/0403689 A1*    12/2020    Rofougaran ........... H04B 7/165

OTHER PUBLICATIONS

International Search Report and Written Opinion—PCT/US2020/031795—ISAEPO—dated Aug. 12, 2020 (192410WO).

\* cited by examiner

BEAMFORMING REPEATERS WITH DIGITALLY ASSISTED INTERFERENCE MITIGATION

CROSS REFERENCE

The present Application for Patent claims the benefit of U.S. Provisional Patent Application No. 62/845,074 by HORMIS et al., entitled "BEAMFORMING REPEATERS WITH DIGITALLY ASSISTED INTERFERENCE MITIGATION," filed May 8, 2019, assigned to the assignee hereof, and expressly incorporated by reference herein.

BACKGROUND

The following relates generally to wireless communications, and more specifically to beamforming repeaters with digitally assisted interference mitigation.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM). A wireless multiple-access communications system may include a number of base stations or network access nodes, each simultaneously supporting communication for multiple communication devices, which may be otherwise known as user equipment (UE).

In some deployments, wireless communications systems may implement wireless repeaters for repeating and extending signals received from base stations to UEs and from UEs to base stations. Some wireless signals may be limited by path-loss through the air, interference from physical blockers, or other constraints. In some cases, wireless repeaters suffer from radiation leakage, in which transmission signals from the repeater "leak" back to the reception path, which may cause instability in the repeater and affect signal quality. Further, one or more transmitting interfering devices, or jammers, may be located in proximity to a UE, a base station, or a repeater. Interference mitigation techniques to reduce the impact of such interference may thus help to enhance network efficiency.

SUMMARY

The described techniques relate to improved methods, systems, devices, and apparatuses that support beamforming repeaters with digitally assisted interference mitigation. In various aspects, described techniques provide a repeater for beamforming a received signal at a millimeter wave (mmW) radio frequency via one or more scan angles or beamforming directions and then retransmitting and beamforming the signal at the mmW radio frequency via one or more scan angles or beamforming directions. Repeaters operating according to various aspects of the present disclosure may include analog and digital components for downconverting on the received signal to reduce a frequency of the signal from the mmW frequency to an intermediate frequency (IF) or baseband frequency, and then filtering the downconverted signal to reduce interference. The filtering may include digital filtering or a combination of analog and digital filtering, in which a set of filter coefficients for the digital filtering is selected based on beamforming parameters used to receive the signal, retransmit the signal, or both. The repeater may then upconvert the filtered signal back to the mmW frequency for the retransmission of the signal.

In some cases, the repeater may determine the beamforming parameters used to receive and retransmit the signal based on demodulating and decoding one or more synchronization signal blocks (SSBs) or reference signals that are received at the mmW frequency. In some cases, the filtering may include digital or analog echo cancellation, filtering of noise from stationary clutter, filtering of noise from time-varying clutter, filtering of interference from one or more jammers, or any combinations thereof.

A method of wireless communication is described. The method may include receiving, at a wireless repeater, a first analog signal at a first antenna array via directional beamforming using a first set of beamforming parameters, converting the first analog signal to a first digital signal, selecting, based on one or more of the first set of beamforming parameters or a second set of beamforming parameters that are to be applied to a second antenna array for transmitting a second analog signal at the wireless repeater, a first set of filter coefficients from set of sets of available filter coefficients for a digital filter, filtering the first digital signal at the digital filter using the first set of filter coefficients to generate a second digital signal, converting the second digital signal to the second analog signal, and transmitting the second analog signal at the second antenna array via directional beamforming using the second set of beamforming parameters.

An apparatus for wireless communication is described. The apparatus may include a processor, memory in electronic communication with the processor, and instructions stored in the memory. The instructions may be executable by the processor to cause the apparatus to receive, at a wireless repeater, a first analog signal at a first antenna array via directional beamforming using a first set of beamforming parameters, convert the first analog signal to a first digital signal, select, based on one or more of the first set of beamforming parameters or a second set of beamforming parameters that are to be applied to a second antenna array for transmitting a second analog signal at the wireless repeater, a first set of filter coefficients from set of sets of available filter coefficients for a digital filter, filter the first digital signal at the digital filter using the first set of filter coefficients to generate a second digital signal, convert the second digital signal to the second analog signal, and transmit the second analog signal at the second antenna array via directional beamforming using the second set of beamforming parameters.

Another apparatus for wireless communication is described. The apparatus may include means for receiving, at a wireless repeater, a first analog signal at a first antenna array via directional beamforming using a first set of beamforming parameters, converting the first analog signal to a first digital signal, selecting, based on one or more of the first set of beamforming parameters or a second set of beamforming parameters that are to be applied to a second antenna array for transmitting a second analog signal at the wireless repeater, a first set of filter coefficients from set of sets of available filter coefficients for a digital filter, filtering the first digital signal at the digital filter using the first set of filter coefficients to generate a second digital signal, converting the second digital signal to the second analog signal, and transmitting the second analog signal at the second antenna array via directional beamforming using the second set of beamforming parameters.

A non-transitory computer-readable medium storing code for wireless communication is described. The code may include instructions executable by a processor to receive, at a wireless repeater, a first analog signal at a first antenna array via directional beamforming using a first set of beamforming parameters, convert the first analog signal to a first digital signal, select, based on one or more of the first set of beamforming parameters or a second set of beamforming parameters that are to be applied to a second antenna array for transmitting a second analog signal at the wireless repeater, a first set of filter coefficients from set of sets of available filter coefficients for a digital filter, filter the first digital signal at the digital filter using the first set of filter coefficients to generate a second digital signal, convert the second digital signal to the second analog signal, and transmit the second analog signal at the second antenna array via directional beamforming using the second set of beamforming parameters.

In some examples of the method, apparatuses, and non-transitory computer-readable medium described herein, the filtering the first digital signal further may include operations, features, means, or instructions for determining, based on the first set of filter coefficients, an estimated interference signal associated with one or more of mutual coupling of the first antenna array and the second antenna array or stationary clutter, and generating the second digital signal based on the estimated interference signal. In some examples of the method, apparatuses, and non-transitory computer-readable medium described herein, the first set of filter coefficients may be predetermined coefficients that are selected based on a combination of the first set of beamforming parameters and the second set of beamforming parameters.

In some examples of the method, apparatuses, and non-transitory computer-readable medium described herein, each set of filter coefficients of the set of sets of available filter coefficients are determined based on a measurement of mutual coupling of the first antenna array and the second antenna array for an associated combination of beamforming parameters of the first antenna array and the second antenna array. Some examples of the method, apparatuses, and non-transitory computer-readable medium described herein may further include operations, features, means, or instructions for performing a calibration procedure to measure mutual coupling for each of a set of combinations of beamforming parameters of the first antenna array and the second antenna array, where the calibration procedure may be performed in initial testing of the wireless repeater, in periodic off-line calibrations of the wireless repeaters, or combinations thereof.

In some examples of the method, apparatuses, and non-transitory computer-readable medium described herein, the filtering the first digital signal further may include operations, features, means, or instructions for dynamically filtering time-varying interference from the first digital signal using one or more of a finite impulse response (FIR) filter, an infinite impulse response (IIR) filter, a non-linear filter, or any combinations thereof.

In some examples of the method, apparatuses, and non-transitory computer-readable medium described herein, the filtering the first digital signal further may include operations, features, means, or instructions for determining, based on the first set of filter coefficients, an estimated interference signal associated with one or more of mutual coupling of the first antenna array and the second antenna array or stationary clutter, converting the estimated interference signal to an analog interference signal, and subtracting the analog interference signal from the first analog signal.

In some examples of the method, apparatuses, and non-transitory computer-readable medium described herein, the filtering the first digital signal further may include operations, features, means, or instructions for determining, based on the first set of filter coefficients, an estimated interference signal associated with one or more of mutual coupling of the first antenna array and the second antenna array or stationary clutter, and subtracting the estimated interference signal from the first digital signal to generate the second digital signal.

In some examples of the method, apparatuses, and non-transitory computer-readable medium described herein, one or more of the first set of beamforming parameters or the second set of beamforming parameters may be determined based on control information received via a control link with a transmitter of the first analog signal, and where the control link may be separate from the first analog signal.

Some examples of the method, apparatuses, and non-transitory computer-readable medium described herein may further include operations, features, means, or instructions for demodulating the first analog signal to obtain one or more reference signals or synchronization signal blocks transmitted via the first analog signal, and determining one or more of the first set of beamforming parameters or the second set of beamforming parameters based on the one or more reference signals or synchronization signal blocks. In some examples of the method, apparatuses, and non-transitory computer-readable medium described herein, the demodulating further may include operations, features, means, or instructions for performing channel estimation and equalization on the first digital signal.

In some examples of the method, apparatuses, and non-transitory computer-readable medium described herein, each of the first set of beamforming parameters and the second set of beamforming parameters include one or more of beam direction parameters, antenna gain parameters, beam-width parameters, or any combinations thereof.

Some examples of the method, apparatuses, and non-transitory computer-readable medium described herein may further include operations, features, means, or instructions for filtering one or more of the first analog signal or the first digital signal to reduce interference from one or more interfering transmitters other than a transmitter of the first analog signal. In some examples of the method, apparatuses, and non-transitory computer-readable medium described herein, the filtering to reduce interference from the one or more interfering transmitters includes one or more of intermediate frequency filtering, analog filtering at down-conversion of the first analog signal to a baseband signal, or any combinations thereof.

Some examples of the method, apparatuses, and non-transitory computer-readable medium described herein may further include operations, features, means, or instructions for down-converting the first analog signal to a baseband signal using a baseband frequency generated by a local oscillator, and where an output of the local oscillator is generated by a voltage controlled oscillator that is tuned based on an output of a carrier tracking component that provides carrier tracking of a first frequency of the first analog signal. In some examples of the method, apparatuses, and non-transitory computer-readable medium described herein, the carrier tracking component receives an input associated with carrier tracking of the first frequency from a control link with a transmitter of the first analog signal. Some examples of the method, apparatuses, and non-transitory computer-readable medium described herein may further include operations, features, means, or instructions for demodulating the first analog signal to obtain one or more reference signals or synchronization signal blocks transmitted via the first analog signal, and determining the first frequency at the carrier tracking component based on the one or more reference signals or synchronization signal blocks. In some examples of the method, apparatuses, and non-transitory computer-readable medium described herein, the one or more reference signals include a tracking reference signal (TRS), phase tracking reference signal (PTRS), or any combinations thereof, and the synchronization signal blocks include a primary synchronization signal, secondary synchronization signal, or any combinations thereof.

In some examples of the method, apparatuses, and non-transitory computer-readable medium described herein, the carrier tracking component includes a phase locked loop circuit.

In some examples of the method, apparatuses, and non-transitory computer-readable medium described herein, the receiving the first analog signal further comprises pre-processing the first analog signal via respective low noise amplifiers and phase shifters that correspond to each of a plurality of antenna elements of the first antenna array based at least in part on the first set of beamforming parameters, the pre-processing resulting in a plurality of pre-processed instances of the first analog signal, and combining, via a combiner circuit of the wireless repeater, the plurality of pre-processed instances of the first analog signal into a combined signal. In some examples of the method, apparatuses, and non-transitory computer-readable medium described herein, the transmitting the second analog signal further comprises dividing, via a divider circuit of the wireless repeater, the second analog signal to a plurality of transmit paths corresponding to a plurality of antenna elements of the second antenna array, each transmit path including at least a phase shifter, a power amplifier driver and a power amplifier, phase shifting the second analog signal at one or more of the transmit paths at a respective phase shifter based at least in part on the second set of beamforming parameters, and amplifying the second analog signal at one or more of the transmit paths at a respective power amplifier driver and power amplifier based at least in part on the second set of beamforming parameters.

In some examples of the method, apparatuses, and non-transitory computer-readable medium described herein, the receiving the first analog signal further comprises phase shifting the first analog signal via respective phase shifters that correspond to each of a plurality of antenna elements of the first antenna array to generate a plurality of phase shifted instances of the first analog signal, the phase shifting based at least in part on the first set of beamforming parameters, combining, via a combiner circuit of the wireless repeater, the plurality of phase shifted instances of the first analog signal into a combined signal, and amplifying, via a low noise amplifier of the first antenna array, the combined signal. In some examples of the method, apparatuses, and non-transitory computer-readable medium described herein, the transmitting the second analog signal further comprises amplifying the second analog signal using a power amplifier driver and a power amplifier of the wireless repeater to generate an amplified second signal, dividing, via a divider circuit of the wireless repeater, the amplified second signal to a plurality of transmit paths corresponding to a plurality of antenna elements of the second antenna array, each transmit path including at least a phase shifter, and phase shifting the amplified second signal at one or more of the plurality of transmit paths based at least in part on the second set of beamforming parameters.

In some examples of the method, apparatuses, and non-transitory computer-readable medium described herein, the first antenna array includes an dual pole antenna array functioning in a first polarization and the second antenna array includes the dual pole antenna array functioning in a second polarization. In some examples of the method, apparatuses, and non-transitory computer-readable medium described herein, the directional beamforming includes digital beamforming, analog beamforming, hybrid beamforming, or any combinations thereof.

In some examples of the method, apparatuses, and non-transitory computer-readable medium described herein, one or more components of the wireless repeater, including one or more of the first antenna array, the second antenna array, one or more switches, one or more couplers, one or more combiners, one or more splitters, one or more filters, one or more phase-shifters, one or more connecting elements, or any combinations thereof, include a meta-material or a material with tunable permittivity and permeability.

In some examples of the method, apparatuses, and non-transitory computer-readable medium described herein, the receiving the first analog signal includes downconverting the first analog signal to a baseband signal using a zero intermediate frequency (ZIF) architecture, low-IF architecture, or a super-heterodyne architecture, and where the transmitting the second analog signal includes upconverting the second analog signal from baseband using a ZIF architecture, low-IF architecture, or a super-heterodyne architecture. In some examples of the method, apparatuses, and non-transitory computer-readable medium described herein, the filtering further may include operations, features, means, or instructions for downconverting the first analog signal to an intermediate frequency signal, and providing the intermediate frequency signal to a surface acoustic wave (SAW) filter, bulk acoustic wave (BAW) filter, a film bulk acoustic wave resonator (FBAR) filter, or any combinations thereof.

Some examples of the method, apparatuses, and non-transitory computer-readable medium described herein may further include operations, features, means, or instructions for monitoring an output of at least one power amplifier of a signal processing chain at the second antenna array, and adjusting, based on the output, one or more of a gain of the at least one power amplifier or a gain of at least one low noise amplifier coupled with the first antenna array.

DETAILED DESCRIPTION

Figure 1:
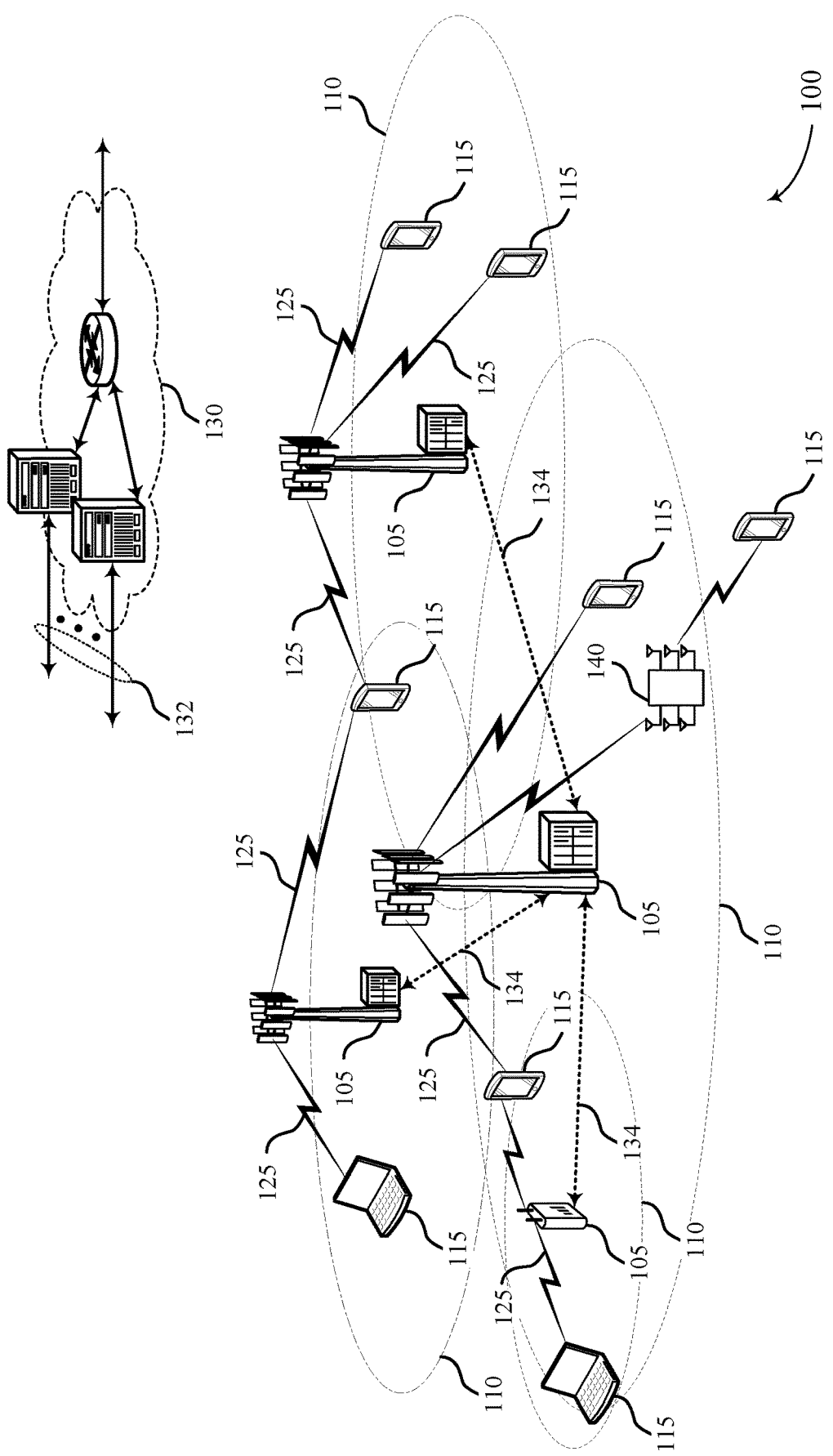
FIG. 1 illustrates an example of a system for wireless communications that supports beamforming repeaters with digitally assisted interference mitigation in accordance with aspects of the present disclosure.

A wireless repeater may repeat, extend, or redirect wireless signals received from a base station to a user equipment (UE), from the UE to the base station, or any combinations thereof. For example, the repeater may receive a signal from a base station and retransmit the signal to a UE, or receive a signal from a UE and retransmit the signal to the base station. In various aspects of the present disclosure, a wireless repeater may use beamformed transmission beams for receiving and retransmitting signals. Such techniques may be employed, in some examples, in systems that use millimeter wave (mmW) communications with relatively narrow beams. In some cases, repeaters may perform interference mitigation to further enhance the reliability of communications between a UE and a base station. According to various aspects of the present disclosure, wireless repeaters may perform digital filtering or a combination of digital and analog filtering on a signal to reduce or eliminate interference from physical obstacles, jamming devices, radiation leakage of the repeater itself, or any combinations thereof.

In some cases, the repeater may receive a signal at a mmW frequency using a first set of beamforming parameters, and downconvert the received signal to reduce a frequency of the signal from the mmW frequency to an intermediate frequency (IF) or baseband frequency. The repeater may then filter the downconverted signal to reduce interference. The filtering may include digital filtering or a combination of analog and digital filtering, in which a set of filter coefficients for the digital filtering is selected based on the first set of beamforming parameters, a second set of beamforming parameters used to retransmit the signal, or combinations thereof. The repeater may then upconvert the filtered signal back to the mmW frequency for retransmission of the signal using the second set of beamforming parameters. In this application, interference canceler and echo canceler components are referred to in some cases as filters. Such filters may include digital filtering or a combination of analog and digital filtering, in which a set of filter coefficients for the digital filtering is selected based on beamforming parameters.

In some cases, the repeater may determine the first set of beamforming parameters and the second set of beamforming parameters based on demodulating and decoding one or more synchronization signal blocks (SSBs), reference signals, or combinations thereof, that are received at the mmW frequency. In other cases, the repeater may determine the first set of beamforming parameters and the second set of beamforming parameters based on information from a control link with the base station that is established using lower frequencies. For example, the mmW transmissions may use mmW frequencies (e.g., the 30 GHz band, or higher, which may be referred to as frequency range 2 (FR2)), and the control link may be a separate low-band connection established using a lower frequency band (e.g., at less than 6 GHz, which may be referred to as sub-6 communications or frequency range 1 (FR1)). In some cases, the low-band connection may be a narrowband Internet-of-Things (NB-IoT) connection. In some cases, the filtering may include digital or analog echo cancellation, filtering of noise from stationary clutter, filtering of noise from time-varying clutter, filtering of interference from one or more jammers, or any combinations thereof.

In some cases, the repeater may be a phased array repeater with an array of reception antennas, an array of transmission antennas, and a signal processing chain, which is used to process the received signals, filter the received signals, and retransmit the signals. In some cases, the array of reception antennas and the array of transmission antennas are the same set of dual pole antennas, which may function in a first polarization as the reception antenna array and a second polarization as the transmission antenna array. The signal processing chain may be implemented as a radio-frequency integrated circuit (RFIC) (e.g., one or more monolithic microwave integrated circuits (MMICs)) and may include a series of phase shifters for controlling the beam width and direction in the reception antenna array and/or the transmission antenna array, heterodyning components to convert signals between RF and IF/baseband, and in some cases filtering components. In some cases, the filtering components may be located off the RFIC (e.g., as a separate filtering module with one or more of digital filtering components, analog filtering components such as surface acoustic wave (SAW), bulk acoustic wave (BAW), film bulk acoustic wave resonator (FBAR) filters, or combinations thereof).

In some cases, carrier tracking of the received signal may be used to tune a local oscillator that is used for downconverting and upconverting signals from and to mmW frequencies. Such carrier tracking may compensate for drifting of the local oscillator that may occur due to, for example, injection pulling at the local oscillator from the higher frequency transmissions at the first frequency, heat-based drift of the local oscillator, mechanical vibration, draft at the remote local oscillator used to generate the first frequency, phase noise, or any combinations thereof. In some cases, carrier tracking adjustments may be made based on the control link between the repeater and the base station or UE, or may be made based on one or more reference signals or synchronization signals received at the mmW frequencies.

In some cases, the series of phase shifters of the RFIC may be controlled by one or more beam controllers (e.g., beamformers). In some cases, the signal processing chain may further include a feedback path for real-time gain control to increase stability within the signal processing chain, in which the feedback path may detect an output of a power amplifier (PA) and adjust a gain to a driver to the PA to improve or maintain signal stability within the RFIC. In some cases, the gain to one or more low noise amplifiers (LNAs) of the signal processing chain may be adjusted based on the output of the PA.

Such techniques may provide more reliable and enhanced communications between a UE and a base station. For example, a system having one or more repeaters operating according to techniques such as described herein may allow for beamformed communications even in the presence of one or more physical blockers (e.g., in non-line-of-sight (NLOS) scenarios such as urban-micro or indoor-hotspot deployments), one or more RF jammers (e.g., adjacent channel, in-band, or out-of-band jammers that may transmit signals that interfere with the beamformed communications between the UE and the base station). By boosting only the desired signal, repeaters as discussed herein may improve the performance of served UEs in the presence of such jammers, physical blockers, or both. Additionally, digital filtering as discussed herein may provide for lower cost and lower complexity components within the repeater. Repeaters as discussed herein may also filter adjacent-channel leakage (emissions) from PAs that couple back into the receive path of the repeater. Thus, relays using techniques as discussed herein may provide a secondary low-loss and un-jammed path between a base station and UE.

Aspects of the disclosure are initially described in the context of a wireless communications system. Aspects of the disclosure are further described in the context of block diagrams of a wireless repeater, circuit diagrams of integrated circuits within the wireless repeater, and process flows. Aspects of the disclosure are further illustrated by and described with reference to apparatus diagrams, system diagrams, and flowcharts that relate to beamforming repeaters with digitally assisted interference mitigation.

FIG. 1 illustrates an example of a wireless communications system 100 that supports beamforming repeaters with digitally assisted interference mitigation in accordance with aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, an LTE-A Pro network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation NodeB or giga-NodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging. In some cases, repeater 140 may be a MTC or IoT device that is controlled by a base station 105 or UE 115 via a low-band or NB-IoT connection and performs repeating of received signals without demodulation or decoding of such signals based on control information provided by the low-band or NB-IoT connection.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1, N2, N3, or other interface). Base stations 105 may communicate with one another over backhaul links 134 (e.g., via an X2, Xn, or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that may be capable of tolerating interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a carrier aggregation configuration in conjunction with component carriers operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving device is equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g., synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based at least in part on listening according to different receive beam directions (e.g., a beam direction determined to have a highest signal strength, highest signal-to-noise ratio, or otherwise acceptable signal quality based at least in part on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use hybrid automatic repeat request (HARD) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical layer, transport channels may be mapped to physical channels.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs 115 that support simultaneous communications via carriers associated with more than one different carrier bandwidth. Wireless communications system 100 may support communication with a UE 115 on multiple cells or carriers, a feature which may be referred to as carrier aggregation or multi-carrier operation. A UE 115 may be configured with multiple downlink component carriers and one or more uplink component carriers according to a carrier aggregation configuration. Carrier aggregation may be used with both FDD and TDD component carriers.

Wireless communications system 100 may include one or more wireless repeaters 140. The wireless repeaters 140 may include functionality of base station 105 and/or UE 115 for repeating, extending, and/or redirecting wireless signals. In some cases, a wireless repeater 140 may be used in line of site (LOS) or non-line of sight (NLOS) scenarios. In a LOS scenario, transmissions, such as mmW transmissions, may be limited by path-loss through air, which may be overcome using beamforming techniques at the wireless repeater 140. In a NLOS scenario, such as in an urban area or indoors, mmW transmissions may be limited by signal blocking or signal interfering physical objects. A mmW beamforming repeater 140 may be utilized to receive a signal from a base station 105 and transmit the signal to the UE 115 and/or receive a signal from a UE 115 and transmit the signal to the base station 105. Beamforming, filtering, and gain control techniques may be utilized to improve signal quality between the base station 105, repeater 140, and UE 115 by isolating signals (e.g., via beamforming) and improving or maintaining stability within a signal processing chain of the repeater (e.g., via filtering, gain control, or combinations thereof).

The wireless repeater 140 may include an array of reception antennas and an array of transmission antennas. In some cases, the array of reception antennas and the array of transmission antennas comprise the same set of dual-pole antennas, wherein the dual pole antennas function in a first polarization as the array of reception antennas and the dual pole antennas function in a second polarization as the array of transmission antennas. In some cases, the antennas comprise meta-material antennas or antenna arrays. The repeater 140 may further include a beam control system and heterodyning circuits, which may comprise a system on chip (SoC) for controlling transmit and/or receive beams to reduce signal interference from jammers, physical blockers, or leakage caused by retransmission. In some cases, the SoC of repeater 140 may include a filter (e.g., a band-pass filter (BPF)) to reduce unwanted signals from the repeated signal. In other cases, such a filter may be located off the SoC (e.g., an off-chip SAW, BAW, or FBAR filter).

In some cases, the wireless repeater 140 is an analog RF repeater with digital filtering, and the wireless repeater 140 may include a signal processing chain connected (e.g., coupled, linked, attached) between the array of reception of antennas and the array of transmission antennas. The signal processing chain may be implemented as a RFIC, which may include RF/microwave components such as one or more phase shifters, LNAs, PAs, PA drivers, heterodyning mixers, carrier tracking circuits, gain controllers, power detectors, filters, or other circuitry, in conjunction with a digital component that may include one or more of digital filters, processors, analog-to-digital (A/D) converters, digital-to-analog (D/A) converters, or other circuitry. The phase shifters may be controlled by one or more beam controllers for beamforming to reduce signal interference. The heterodyning mixers may downconvert a frequency of a received signal to an IF or baseband frequency, that may be filtered by the one or more filters, and the heterodyning mixers may upconvert the filtered signal back to the higher frequency. The signal processing chain may include a feedback path for monitoring the output of one or more PAs, and adjusting gains to one or more PA drivers to the PAs and gains to one or more LNAs based on the output. The gain adjustment may function to stabilize the signal reception and transmission and improve signal quality between devices such as base station 105 and UE 115. Accordingly, through beamforming, filtering, and gain control, signal quality (e.g., mmW signals) may be improved in LOS and NLOS scenarios.

As described, the wireless repeater 140 may include components (e.g., antenna arrays and signal processing chain circuitry) in the analog/RF domain, as well as one or more digital filters, or both analog and digital filters. Further, in some cases the wireless repeater 140 may include digital circuitry for receiving control information (e.g., for receiving remote configuration of gain, direction, and local oscillator tracking via a low-band or FR1 connection such as a NB-IoT connection or via mmW signals). In some cases where the control information is not received via the mmW signals, the control information may be received using a different radio access technology than used between the base station 105 and UE 115. For example, one or more side channels may be used to provide control information and implemented as Bluetooth, ultra-wide band, wireless LAN, etc. protocols, and as such, the repeater may include circuitry and/or processors for receiving and processing signals received via those protocols and controlling beamforming at the RF components based on those signals received at the side channel.

Figure 2:
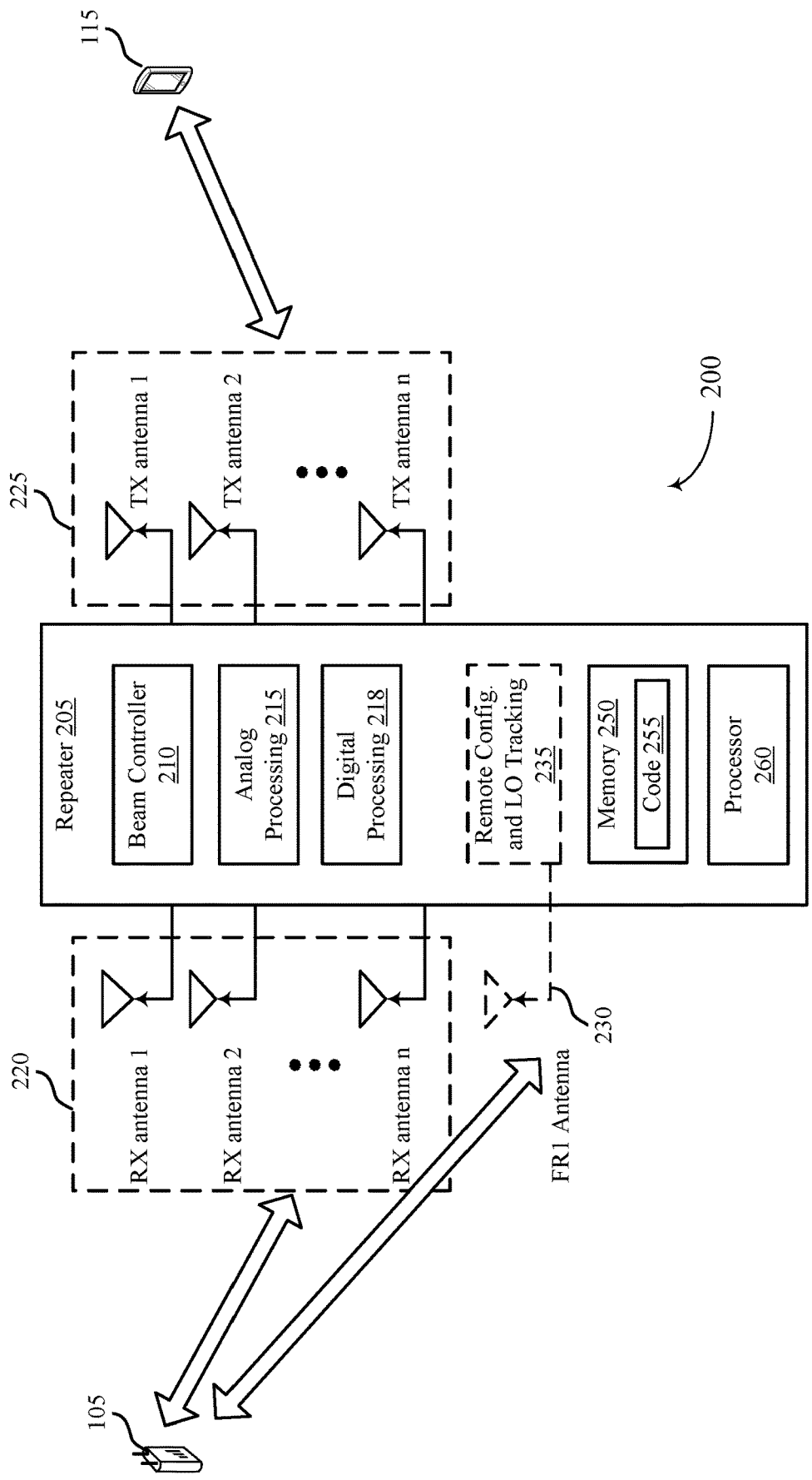
FIG. 2 illustrates an example of a block diagram of a configurable beamforming repeater that supports beamforming repeaters with digitally assisted interference mitigation in accordance with aspects of the present disclosure.

FIG. 2 illustrates an example of a block diagram of a configurable beamforming repeater 200 that supports beamforming repeaters with digitally assisted interference mitigation in accordance with aspects of the present disclosure. In some examples, block diagram of a configurable beamforming repeater 200 may implement aspects of wireless communications system 100. In some examples, the devices of FIG. 2 may implement aspects of wireless communications system 100, and the repeater 205 may be an example of the repeater 140 of FIG. 1. The block diagram includes a base station 105 and a UE 115. The repeater 205 includes a reception antenna array 220 including a set of antennas, and a transmission antenna array 225 including a set of antennas. In some cases, the reception antenna array 220 and the transmission antenna array 225 are the same antenna arrays including the same set of dual pole antennas functioning in first and second polarizations as the reception and the transmission antenna array. In some cases, the reception antenna array 220 and/or the transmission antenna array 225 comprise meta-material antennas.

The repeater 205 may further include a beam controller 210 and an analog processing chain 215, which may include various circuitry including one or more PAs, LNAs, phase shifters, dividers, mixers, filters, combiners, or any combinations thereof. The analog processing chain may include various analog/RF domain components that may be implemented as a RFIC (e.g., MMIC). The repeater 205 may also include a digital processing chain 218, which may include one or more digital filters that may filter signals that are to be retransmitted by the repeater 205. The repeater 205 may also include memory 250 (which may include computer executable code 255) and a processor 260, which may be used to control one or more of the digital processing chain 218, analog processing chain 215, or beam controller 210.

Beam controller 210 (e.g., a beamformer) may control beam direction and width of the reception antennas at reception antenna array 220, the transmission antennas at transmission antenna array 225, or both using the phase shifters to improve or maintain isolation between various reception and transmission beams. In some cases, the beam controller 210, using the phase shifters, controls beam direction to ensure target reception and transmission beams are sufficiently spread apart to avoid interference. Furthermore, the beam controller 210 may utilize antenna adjustments to adjust beam width, such as certain amplitude and phase offsets to signals carried via the antenna elements of the reception antenna array 220 and the transmission antenna array 225. In some cases, the adjustments associated with the antenna elements may be defined by a set of beamforming parameters (e.g., a beamforming weight set) that are used at the antenna arrays 220 and 225. For example, the beam controller 210 may use a first set of beamforming parameters for receiving signals at reception antenna array 220, and a second set of beamforming parameters for transmitting signals at transmission antenna array 225.

The analog processing chain 215, in some examples, may downconvert received signals from the base station 105 from a received mmW to a baseband signal. The baseband signal may be filtered to reduce interference from frequencies outside of a frequency window (e.g., frequencies outside of a predefined range of a center frequency of the received signals). In some cases, the filtering may be performed using one or more digital filters, or both digital and analog filters that may be located on or off of an RFIC. In some cases, a set of filter coefficients for digital filtering is selected based on the first set of beamforming parameters used for receiving the signal, the second set of beamforming parameters used to retransmit the signal, or combinations thereof. The repeater 205 may then upconvert the filtered signal back to the mmW frequency for retransmission of the signal using the second set of beamforming parameters at the transmission antenna array 225.

In some cases, carrier tracking for an adjustment of a local oscillator used to downconvert and upconvert the signals between the mmW frequencies and baseband, the beamforming parameters, as well as gain adjustments may be controlled by the base station 105 via a side control channel. For example, the beam controller 210 may receive control information from remote configuration and local oscillator tracking component 235, which may communicate with base station 105 using non-beamformed communications and a lower frequency antenna 230 (e.g., via a NB-IoT connection using FR1). Additionally or alternatively, control information may be provided by base station 105 via a side channel implemented as a Bluetooth channel, ultra-wide band channel, wireless LAN channel, etc. Accordingly, the repeater 205 may include circuitry for receiving and processing side channel communications to control the beam controller 210. The base station 105 may transmit beamforming control configurations based on operating environment, position of the UE 115, configuration of the UE 115, any detected jammers, or any combinations thereof.

In other cases, carrier tracking for an adjustment of a local oscillator used to downconvert and upconvert the signals between the mmW frequencies and baseband, the beamforming parameters, as well as gain adjustments may be controlled based on demodulating and decoding one or more SSBs, reference signals, or combinations thereof, that are received at the mmW frequency. In such cases, the repeater 205 may demodulate and decode the one or more SSBs or reference signals to identify control information and perform carrier tracking.

While various examples discussed herein describe that a repeater 205 may receive signals from the base station 105 according to a beamforming configuration and retransmit the signals to the UE 115 according to a beamforming configuration. The repeater 205 may further receive signals from the UE 115 according to a beamforming configuration and retransmit the signals to the base station 105 according to a beamforming configuration. As such, the repeater 205 may function to implement uplink and downlink communications, and may be utilized for communication in uplink or downlink scenarios.

Figure 3:
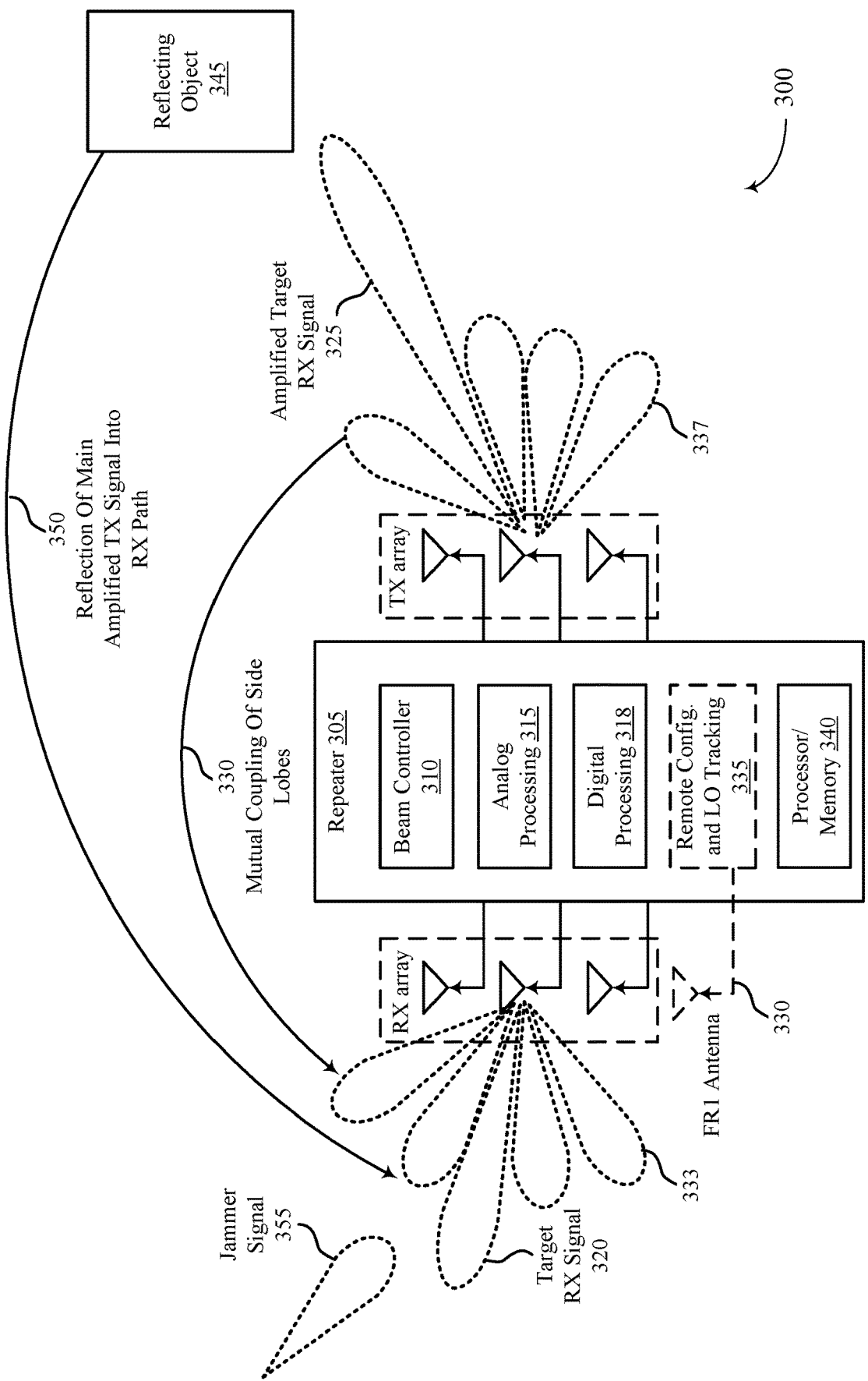
FIG. 3 illustrates an example of a block diagram of a configurable beamforming repeater that supports beamforming repeaters with digitally assisted interference mitigation in accordance with aspects of the present disclosure.

FIG. 3 illustrates an example of a block diagram of a configurable beamforming repeater 300 that supports beamforming repeaters with digitally assisted interference mitigation in accordance with aspects of the present disclosure. In some examples, the devices of FIG. 3 may implement aspects of wireless communications system 100. A repeater 305 may include a reception antenna array and transmission antenna array as described with respect to FIG. 2. The repeater 305 may beamform the received signal via various beam directions (or scan angles). Lobes (e.g., lobes 320 and 333) illustrate the effective spatial shape of the received signal power after beamforming within the repeater. The lobe 320 (e.g., main lobe) is typically directed to a target reception signal, which may be transmitted by a UE 115 or a base station 105. The target reception signal may correspond to the signal to be retransmitted to another device such as a UE 115 or base station 105. Lobes (e.g., lobes 325 and 337) illustrate the effective spatial shape of a transmitted signal power after beamforming within the repeater. The beam controller 310 may adjust the beam configuration such that the reception antenna array receives a higher quality target signal. In some cases, a jamming device may transmit a jamming signal 355 that may cause interference with a received signal at repeater 305. In some cases, an analog processing 215 component or chain may perform beamforming (e.g., using phase shifters, LNAs, etc.), and downconvert a received signal to a baseband signal, which may be filtered at digital processing 318 component to reduce or eliminate interference (e.g., from the jammer signal 355, reflections 350, mutual coupling 330, or combinations thereof). Analog processing 315 component may then upconvert the filtered signal back to the RF millimeter wave frequency, and retransmit the signal to a UE.

In some cases, the interfering signals from the jamming signal 355 may be present at a different frequency than a frequency of the target reception signal. For example, configurable beamforming repeater 305 may operate in a relatively well-regulated frequency band that prevents concurrent transmissions of devices at the same frequency. However, in some cases the jamming signal 355 may have a significantly higher power than the target reception signal, which may drive one or more receive chains associated with the reception antenna array into gain compression. Further, even though the jamming signal 355 may be non-overlapping in frequency with the target reception signal, it may cause the one or more receive chains to generate intermodulation terms that may overlap with the target reception signals and degrade the SNR. Techniques such as discussed herein may reduce such interference and thereby enhance the SNR of the repeated signal from the configurable beamforming repeater 305. In some cases, carrier tracking and filter coefficient selection may be performed similarly as discussed with respect to FIG. 2. Various examples of components of repeater 305 and operations of the repeater 305 are discussed in examples of FIGS. 5 through 13. It should be understood that circuitry of repeater 305 may be configured in layouts not specifically illustrated in FIGS. 11 through 15. In some cases, the beam controller 310 may further adjust the beam configuration of the transmission antenna array such that the target device receives a higher quality signal. In some cases, a transmit or receive beam is amplified for better reception or retransmission of the target signal. In some cases, the gain, beamforming configuration, or both may be configured based on information from the remote configuration and local oscillator tracking component 335, by the processor/memory 340 component(s), or combinations thereof.

Arrow 330 illustrates possible signal reception and retransmission interference via mutual coupling (e.g., signal leakage) of side lobes of the respective beam configurations of the reception antenna array and the transmission antenna array. In some cases, the beam controller 310 may adjust beam width, direction, or both to avoid the mutual coupling. Furthermore, in some cases the analog processing 315 may implement gain control techniques to improve stability and reduce interference in the repeater 305. Arrow 350 illustrates reflection of an amplified signal (e.g., lobe 325) from a reflecting object 345 and to the signal reception beam configuration, which may cause signal interference or leakage. The beam controller 310 may adjust beam width, direction, or both to avoid interference via reflection. In some cases, the analog processing 315, digital processing 318, or combinations thereof may be implemented as a RFIC. In some cases, the aspects of this disclosure may be implemented using digital systems and components. In some case, the meta-material antennas described in FIG. 12 may be used in the circuitry illustrated with respect to FIGS. 5-10. In some cases, when the meta-material antennas are utilized, the circuitry may not include phase shifters and/or feedback paths.

In some cases, digital processing 318 components, in conjunction with processor/memory 340, may demodulate and decode the one or more SSBs or reference signals and perform channel estimation and equalization, to identify control information and perform carrier tracking. For example, beamforming control information may be determined based on information in a SSB, which may be used to set receive and transmit beamforming parameters (e.g., to set direction, gain and beam-width of transmission and reception beams). Further, carrier tracking may be based on one or more reference signals received from the base station at mmW frequencies. In such cases, the remote configuration and local oscillator tracking component 335 may not be necessary, and thus an optional part of repeater 305.

Additionally, digital processing 318 components may include one or more digital filters that may perform digital-assisted cancelation of "echo" due to mutual coupling of side lobes as indicated at arrow 330. In some cases, filtering coefficients for mutual coupling, as well as for stationary clutter, may be pre-computed based on beam configuration that may be configured in a one-time or periodic off-line calibration stage. Further, time-varying clutter echo may be estimated and cancelled dynamically. Such filtering may allow forward gain (in dB) to be increased one-to-one with echo cancelation (in dB). In some cases, echo cancelation may be performed and applied to analog signals, which may reduce dynamic range requirements of the A/D converter.

Figure 4:
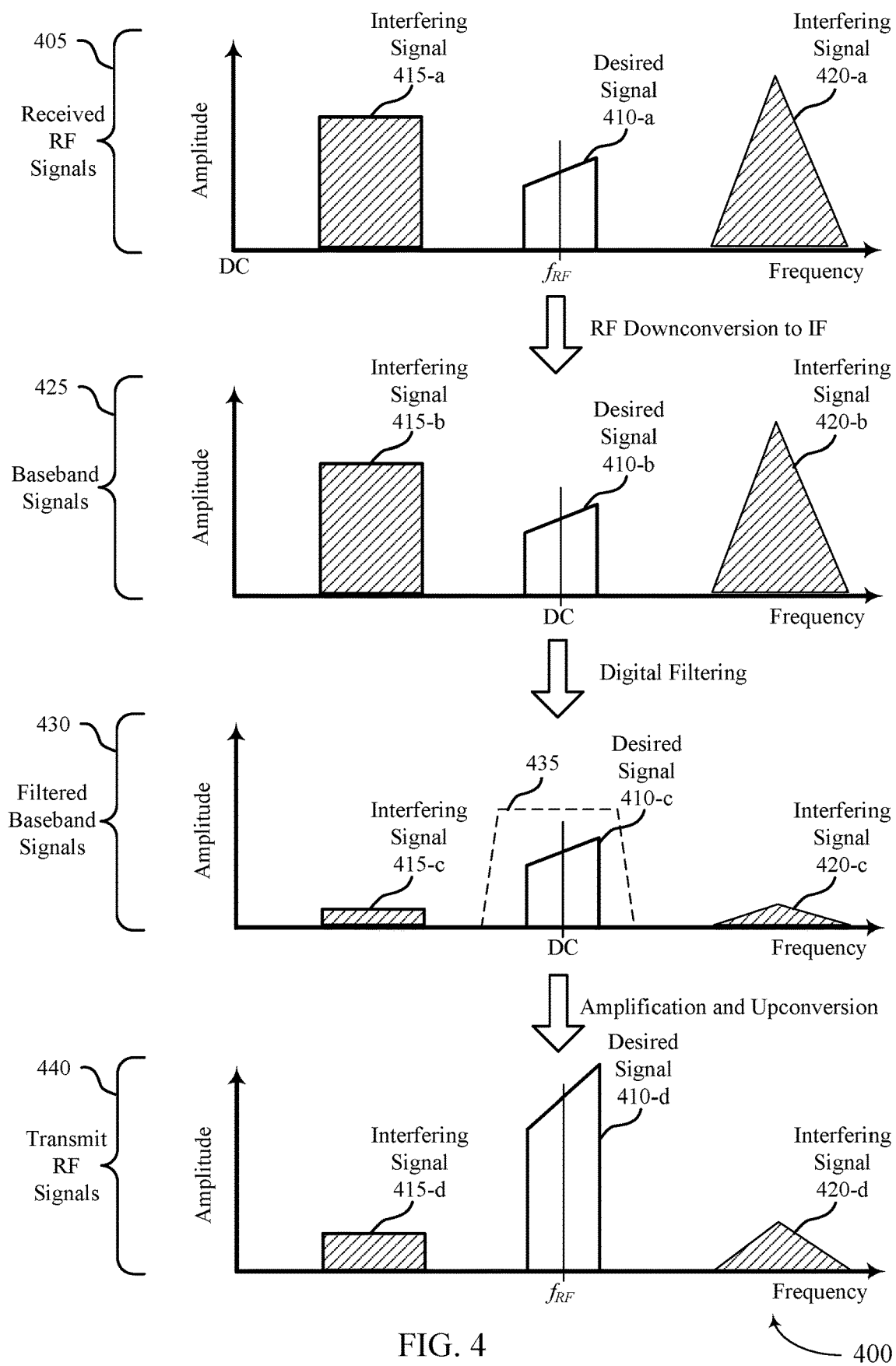
FIG. 4 illustrates an example of a filtering technique that supports beamforming repeaters with digitally assisted interference mitigation in accordance with aspects of the present disclosure.

FIG. 4 illustrates an example of a filtering technique 400 that supports beamforming repeaters with digitally assisted interference mitigation in accordance with aspects of the present disclosure. In some examples, filtering technique 400 may implement aspects of wireless communications system 100. In this example, a repeater (e.g., a repeater 140, 205, or 305) may receive RF signals 405. The RF signals 405 may be received, for example, from a base station and are to be retransmitted to one or more UEs, or may be received from a UE and are to be retransmitted to one or more base stations. The received signals may include a desired signal 410-$a$, having a center frequency of fir, a first interfering signal 415-$a$, and a second interfering signal 420-$a$. The interfering signals may be generated from reflections due to clutter, mutual coupling, one or more jammers, or combinations thereof, for example.

The repeater may perform RF downconversion (e.g., by mixing the received RF signals with an output of a local oscillator) to generate baseband signals 425, which include a representation of the desired signal 410-$b$ at DC, as well as the first interfering signal 415-$b$ and the second interfering signal 420-$b$. The repeater may then perform filtering on the baseband signals 425 to generate filtered baseband signals 430. In some cases, the filtering may be band-pass filtering in a frequency window 435, which largely maintains the amplitude of the desired signal 410-$c$, and attenuates both the first interfering signal 415-$c$ and the second interfering signal 420-$c$. In some cases, the filtering may be digital filtering using an initial set of filtering coefficients that are determined based on beamforming parameters of a receive beam, transmit beam, or both.

Following the filtering, the repeater may amplify and upconvert the filtered signals 430 to generate transmit RF signals 440. In this example, the desired signal 410-*d* of the transmit RF signals 440 has a larger amplitude than the transmitted first interfering signal 415-*d* or transmitted second interfering signal 420-*d*, which thus increases the signal to noise ratio at a receiving device and may enhance the likelihood of successful reception of the desired signal 410-*d* at the receiving device.

Figure 5:
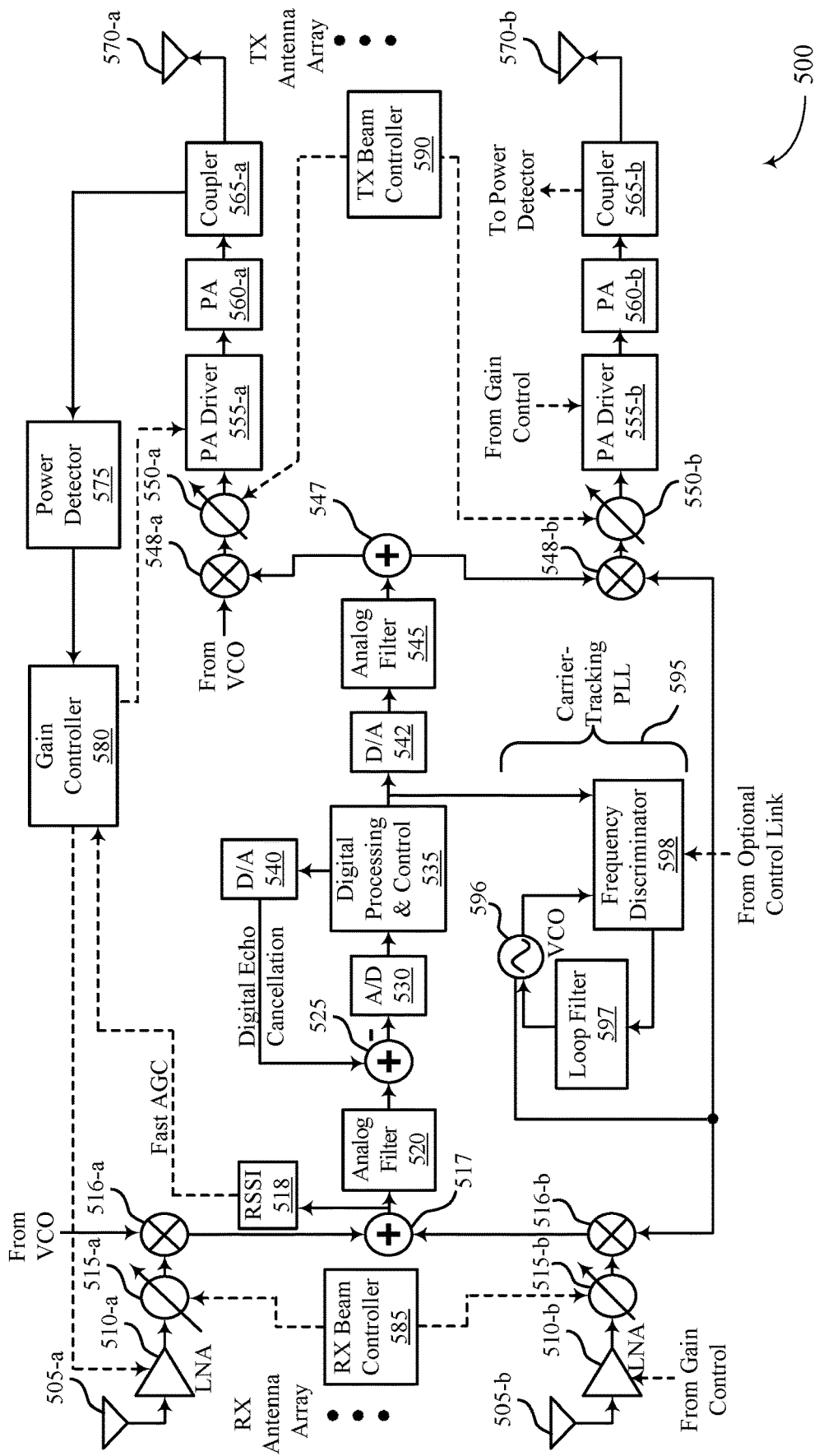
FIG. 5 illustrates an example of a circuit diagram of a signal processing chain that supports beamforming repeaters with digitally assisted interference mitigation in accordance with aspects of the present disclosure.

FIG. 5 illustrates an example of a circuit diagram of a signal processing chain 500 that supports beamforming repeaters with digitally assisted interference mitigation in accordance with aspects of the present disclosure. In some examples, circuit diagram of a signal processing chain 500 may implement aspects of wireless communications system 100. In some examples, circuit diagram of a signal processing chain 500 may be implemented in a repeater (e.g., repeater 140, 205, or 305) in aspects of wireless communications system 100. The signal processing chain 500 includes a number of components between a receive antenna array 505 and a transmit antenna array 570, which may include a low noise amplifier (LNA) 510 component, phase shifter 515 component, a downconversion mixer 516. In some cases, RX beam controller 585 may provide signals applied to the phase shifter 515-*a* through 515-*b*, associated antennas 505-*a* through 505-*b* may receive a signal, which is routed to the LNAs 510-*a* through 510-*b*, and phase shifters 515-*a* through 515-*b*. The downconverted signal may be provided to combiner circuit 517, which may be an example of a Wilkinson power combiner or other RF signal combining circuit, that combines the instances of the received signal from the receive antennas 505 into a combined signal.

An analog filter 520 (e.g., which may perform image rejection of microwave signals) may be located after the combiner 517, and may provide an indication of a received signal strength indicator (RSSI) 218 that may be used for fast automatic gain control (AGC). The analog filter 520 may output a filtered signal to a subtracting combiner 525 that may subtract an estimation for of digital echo cancelation from the filtered signal. An A/D converter 530 may convert the filtered signal to a digital filtered signal, which may be provided to digital processing and control circuitry 535. The digital processing and control circuitry 535 may perform digital processing, such as digital filtering, demodulation and decoding, channel estimation, carrier tracking, or combinations thereof, on the received filtered signal to output a processed digital signal. In some cases, the digital processing and control circuitry 535 may output an estimate of echo cancelation to a D/A converter 540 that converts the estimate to an analog echo cancelation estimate that is used by the subtracting combiner 525 to subtract the estimated echo cancelation from the analog signal. Such analog echo cancelation may allow for a A/D converter 530 with reduced dynamic range requirements, which may allow for reduced complexity and cost of the digital processing and control circuitry 535. In some cases, digital filtering used in the digital processing and control circuitry 535 may have an initial set of coefficient values that are selected from a number of available sets of coefficient values based on transmit beamforming parameters, receive beamforming parameters, of combinations thereof. In some cases, filtering may use a combination of analog, piezo-electric (SAW/BAW/FBAR), and digital filters. Various examples of digital processing and control circuitry are discussed with reference to FIGS. 8 through 10.

The processed digital signal from the digital processing and control circuitry 535 may be converted to an analog signal at D/A converter 542, which may be provided to an analog filter 545 (e.g., a microwave filter), and then to a divider circuit 547. Divider circuit 547, which may be an example of a Wilkinson power divider or other RF signal dividing circuit, divides the output of the analog filter 545 to a plurality of transmit paths corresponding to the plurality of antennas 570 of the transmit antenna array. Each transmit path may include an upconversion mixer 548, a phase shifter 550, PA driver 555, PA 560, and a coupler 565. Power detector(s) 575 are coupled to each of the transmit paths via couplers 565 and monitor the output of the PAs 560 of each transmit path. Based on the monitored output and the RSSI 518, the gain controller 580 may adjust a gain of one or more of the PA drivers 555, the gain of the LNAs 510, or any combinations thereof. Accordingly, using the PA output, the gain controller 580 may increase or maintain stability of signal transmission within the signal processing chain. The couplers 565 and power detector 575 may comprise respective feedback paths, which are coupled to the gain controller 580.

In some cases, components between the RX antenna array including antennas 505 and the TX antenna array including antennas 570 may be considered the signal processing chain and may be implemented using an RFIC, one or more digital processing components, or combinations thereof. The baseband signals may be downconverted and upconverted by mixing a signal at a local oscillator (LO) frequency that is generated by voltage controlled oscillator 596. In this example, a carrier tracking PLL 595 may tune the VCO 596 using frequency discriminator 598 and loop filter 597. In other examples, a free-running LO may be used. In some cases, the upconversion and downconversion may be performed with zero intermediate frequency (ZIF), low-IF, or super-heterodyne RF architectures. In some cases, the particular architecture selected to implement a circuit such as signal processing chain 500 may be based on desired linearity, range, die-size, power of RF components, or any combinations thereof.

Figure 6:
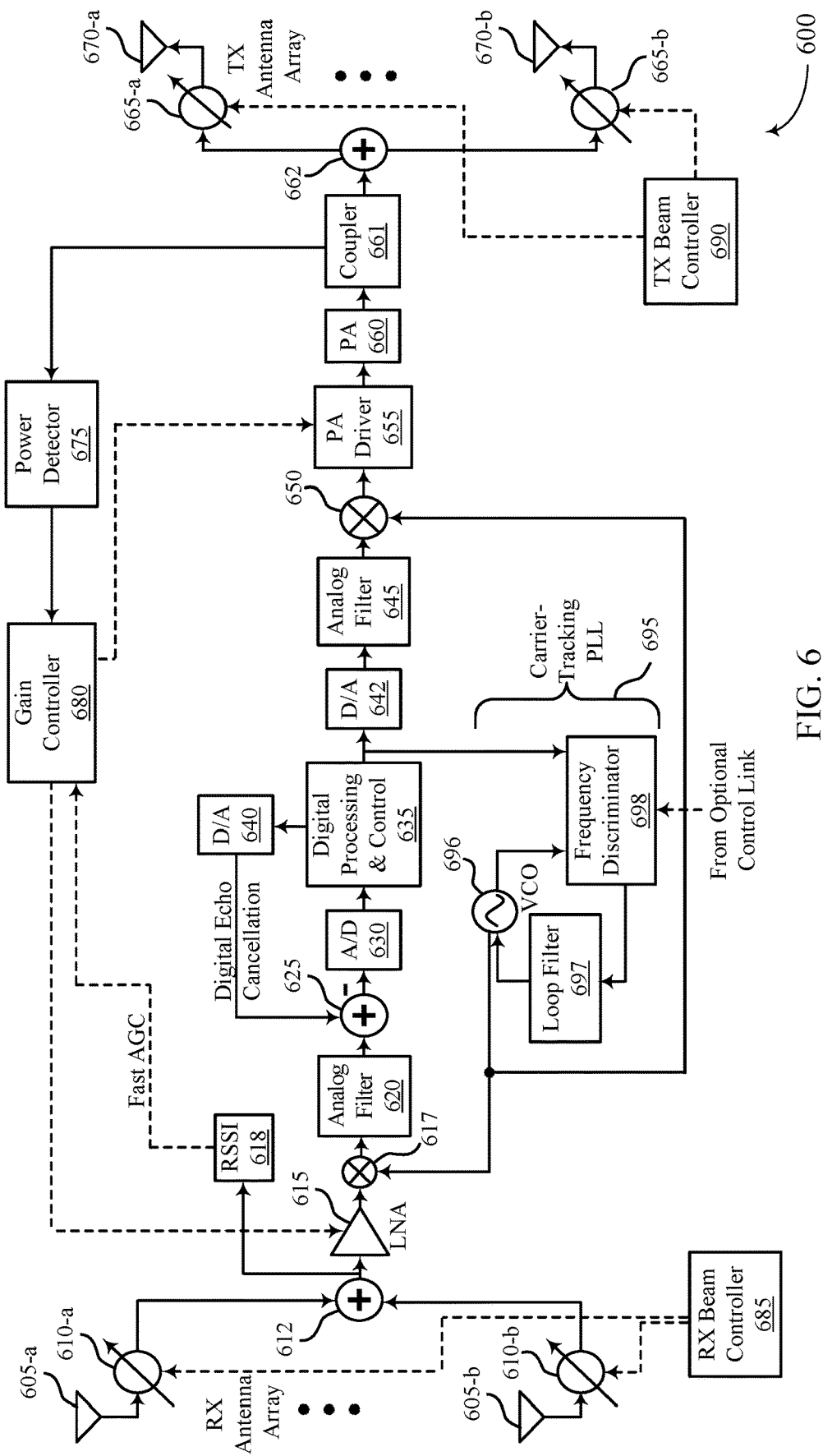
FIG. 6 illustrates an example of a circuit diagram of a signal processing chain that supports beamforming repeaters with digitally assisted interference mitigation in accordance with aspects of the present disclosure.

FIG. 6 illustrates another example of a circuit diagram of a signal processing chain 600 that supports beamforming repeaters with digitally assisted interference mitigation in accordance with aspects of the present disclosure. In some examples, circuit diagram of a signal processing chain 600 may implement aspects of wireless communications system 100. In some examples, circuit diagram of a signal processing chain 600 may be implemented in a repeater (e.g., repeater 140, 205, or 305) in aspects of wireless communications system 100.

The signal processing chain 600 in this example uses a single LNA and PA for receiving and transmitting signals, and includes a number of components between a receive antenna array 605 and a transmit antenna array 670. In this example, phase shifters 610 may be associated with each antenna element 605 of the receive antenna array. The RX beam controller 685 may adjust phase shifters 610 in accordance with receive beamforming parameters. For example, RX beam controller 685 may provide signals applied to the phase shifter 610-*a* through 610-*b*, associated antennas 605-*a* through 605-*b* may receive a signal, which is routed to combiner 612, which may be an example of a Wilkinson power combiner or other RF signal combining circuit, that combines the instances of the signal into a combined signal. The combined signal may be provided to an estimator for RSSI 618, which may determine RSSI for fast AGC, in this example. A LNA 615 may receive the combined signal and amplify the signal based on input from gain controller 680.

A downconversion mixer 617 may receive the amplified signal and downconvert the signal to baseband. Analog filter 620 (e.g., which may perform image rejection of microwave signals) may be located after the downconversion mixer 617. The analog filter 620 may output a filtered signal to a subtracting combiner 625 that may subtract an estimation for of digital echo cancelation from the filtered signal. An A/D converter 630 may convert the filtered signal to a digital filtered signal, which may be provided to digital processing and control circuitry 635. The digital processing and control circuitry 635 may perform digital processing and control similarly as discussed with respect to FIGS. 5 and 8 through 10. In some cases, the digital processing and control circuitry 635 may output an estimate of echo cancelation to a D/A converter 640 that converts the estimate to an analog echo cancelation estimate that is used by the subtracting combiner 625 to subtract the estimated echo cancelation from the analog signal.

The processed digital signal from the digital processing and control circuitry 635 may be converted to an analog signal at D/A converter 642, which may be provided to an analog filter 645 (e.g., a microwave filter), and then to upconverting mixer 650, PA driver 655, PA 660, and a coupler 661. The amplified signal from coupler 661 may be provided to a divider circuit 662. Divider circuit 662, which may be an example of a Wilkinson power divider or other RF signal dividing circuit, divides the output to a plurality of transmit paths corresponding to the plurality of antennas 670 of the transmit antenna array. Each transmit path may include a phase shifter 665 that adjusts phase based on signals from TX beam controller 690.

Power detector 675 is coupled to the transmit paths via coupler 661 and monitors the output of the PA 660. Based on the monitored output and the RSSI 618, the gain controller 680 may adjust a gain of one or more of the PA driver 655, the gain of the LNA 615, or any combinations thereof. Accordingly, using the PA output, the gain controller 680 may increase or maintain stability of signal transmission within the signal processing chain. The coupler 661 and power detector 675 may comprise a feedback path, which is coupled to the gain controller 680.

In some cases, components between the RX antenna array including antennas 605 and the TX antenna array including antennas 670 may be considered the signal processing chain and may be implemented as a RFIC, digital component(s), or combinations thereof, similarly as discussed with respect to FIG. 5. The received signals may be downconverted to baseband at downconversion mixer 617 by mixing the received signal with a signal at a local oscillator (LO) frequency that is generated by voltage controlled oscillator 696. In this example, a carrier tracking PLL 695 may tune the VCO 696 using frequency discriminator 698 and loop filter 697. In other examples, a free-running LO may be used. Likewise the filtered and processed baseband signals may be upconverted back to RF at upconversion mixer 650 by mixing the baseband signal with the LO frequency that is generated by voltage controlled oscillator 696.

Figure 7:
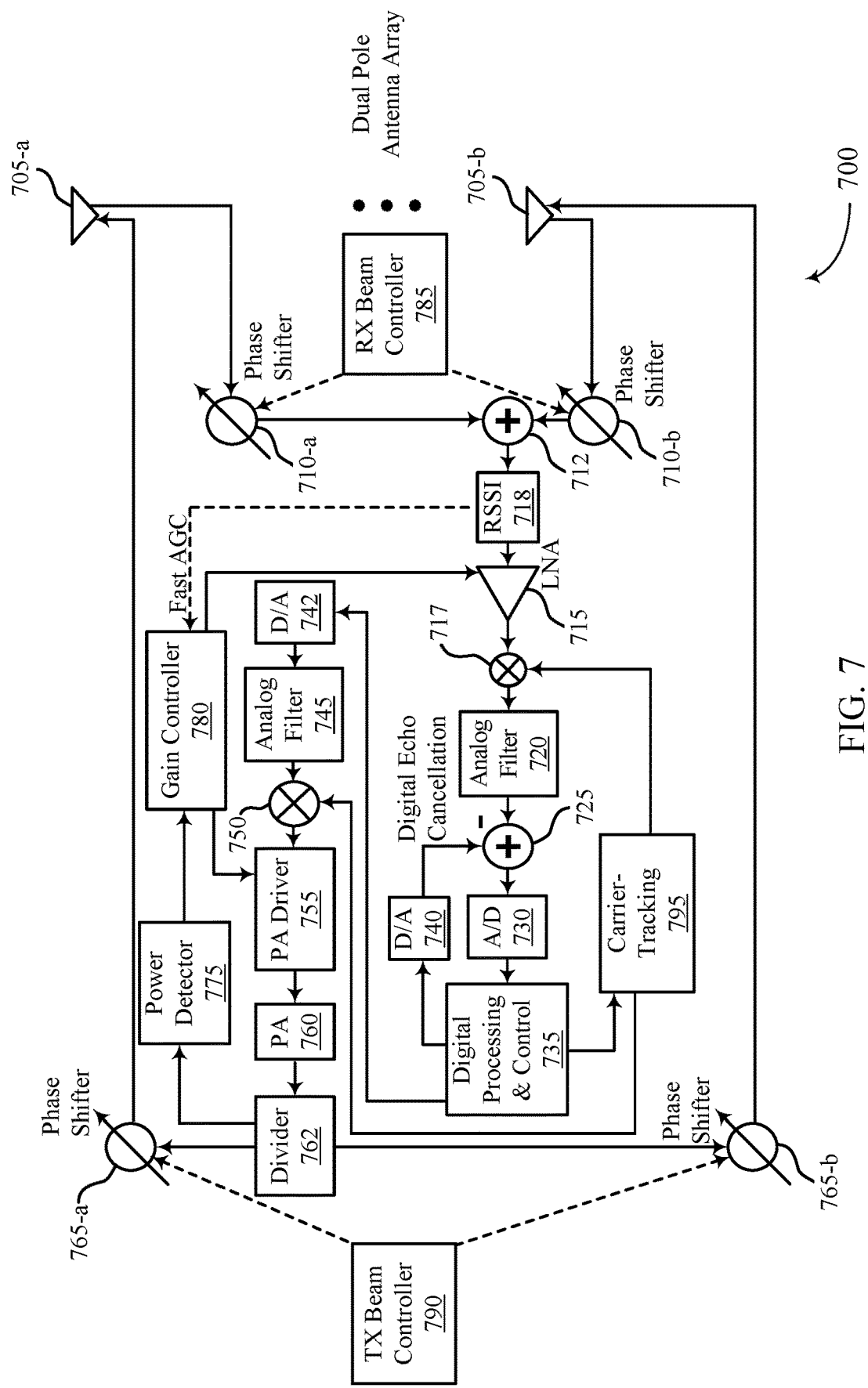
FIG. 7 illustrates an example of a circuit diagram of a signal processing chain that supports beamforming repeaters with digitally assisted interference mitigation in accordance with aspects of the present disclosure.

FIG. 7 illustrates an example of a circuit diagram of a signal processing chain 700 that supports beamforming repeaters with digitally assisted interference mitigation in accordance with aspects of the present disclosure. In some examples, circuit diagram of a signal processing chain 700 may implement aspects of wireless communications system 100. In this example, the repeater may include antennas 705 that are dual pole antennas. When the antennas 705 function in a first polarization, the antennas 705 may function as reception antennas, and when the antennas 705 function in a second polarization, the antennas may function as transmission antennas. Accordingly, the same set of antennas 705 may be considered a reception antenna array and a transmission antenna array, dependent on the polarity. It should be understood that the antennas 705 may function in different polarizations simultaneously or contemporaneously. The various components, including RSSI measurement component 718, LNA 715, phase shifters 710 and 765, combiner circuit 712, divider circuit 762, PA driver 755, PA 760, RX beam controller 785, TX beam controller 790, gain controller 780, and power detector 775, which are all coupled with the antennas 705 of an antenna array, and may perform functions as discussed above with respect to FIGS. 5 and 6.

In this example, signals received at the antennas 705 may be provided to receive paths including phase shifters 710 corresponding to each of the plurality of dual pole antennas 705 functioning in the first polarization to comprise the first antenna array. Combiner circuit 712 may receive the plurality of instances of the signal from the receive paths into a combined signal, which is routed to a RSSI measurement component 718, LNA 715, downconverting mixer 717, and analog filter 720 (e.g., a microwave filter). The analog filter 720 may output a filtered signal to a subtracting combiner 725 that may subtract an estimation of digital echo cancelation from the filtered signal. An A/D converter 730 may convert the filtered signal to a digital filtered signal, which may be provided to digital processing and control circuitry 735. The digital processing and control circuitry 735 may perform digital processing and control similarly as discussed with respect to FIGS. 5 and 8 through 10. In some cases, the digital processing and control circuitry 735 may output an estimate of echo cancelation to a D/A converter 740 that converts the estimate to an analog echo cancelation estimate that is used by the subtracting combiner 725 to subtract the estimated echo cancelation from the analog signal.

The processed digital signal from the digital processing and control circuitry 735 may be converted to an analog signal at D/A converter 742, which may be provided to an analog filter 745 (e.g., a microwave filter), and then to upconverting mixer 750, PA driver 755, and PA 760. The amplified signal from PA 760 may be provided to a divider circuit 762. Divider circuit 762, which may be an example of a Wilkinson power divider or other RF signal dividing circuit, divides the output to a plurality of transmit paths corresponding to the plurality of antennas 705 of the transmit antenna array functioning in the second polarization. Each transmit path may include a phase shifter 765 that adjusts phase based on signals from TX beam controller 790.

Power detector 775 is coupled to the transmit paths via divider 762 (e.g., via a coupler associated with the divider 762) and may monitor the output of the PA 760. Based on the monitored output and the RSSI 718, the gain controller 780 may adjust a gain of one or more of the PA driver 755, the gain of the LNA 715, or any combinations thereof. Accordingly, using the PA output, the gain controller 780 may increase or maintain stability of signal transmission within the signal processing chain.

The received signals may be downconverted to baseband at downconversion mixer 717 by mixing the received signal with a signal at a local oscillator (LO) frequency that is generated by carrier tracking component 795 (e.g., that includes a VCO tuned by a carrier tracking PLL). In other examples, a free-running LO may be used. Likewise the filtered and processed baseband signals may be upconverted back to RF at upconversion mixer 750 by mixing the baseband signal with the LO frequency that is generated by the carrier tracking component 795.

Figure 8:
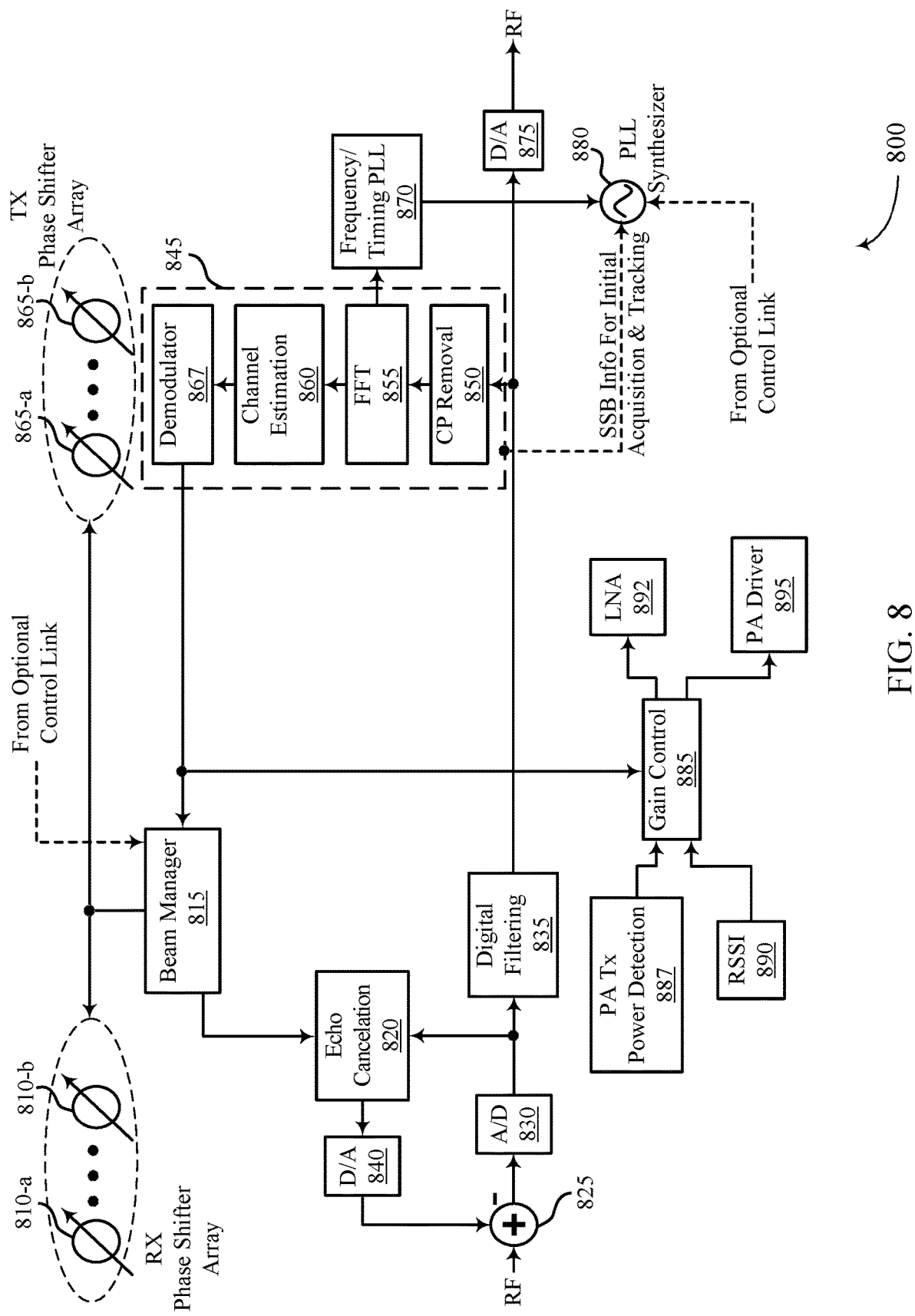
FIG. 8 illustrates an example of a digital flow that supports beamforming repeaters with digitally assisted interference mitigation in accordance with aspects of the present disclosure.

FIG. 8 illustrates an example of a digital flow 800 that supports beamforming repeaters with digitally assisted interference mitigation in accordance with aspects of the present disclosure. In some examples, digital flow 800 may implement aspects of wireless communications system 100. In some examples, various digital components of the digital flow 800 may be implemented in digital processing and control circuitry (e.g., digital processing and control circuitry 535, 635, or 735 of FIGS. 5 through 7) within a repeater (e.g., repeater 140, 205, or 305).

In this example, a receive phase shifter array 810 may include a number of phase shifters 810-a through 810-b, which may be coupled with respective antenna elements. Likewise, a transmit phase shifter array 865 may include a number of phase shifters 865-a through 865-b, which may be coupled with respective antenna elements. A beam manager 815 may control an amount of phase shift applied at each phase shifter according to beamforming parameters that are determined based on an optional control link (e.g., a secondary control link established on FR1) or based on optional in-band signaling circuitry 845. Beam manager 815, in some cases, may also provide information to an echo cancelation component 820 that may perform filtering to provide echo cancelation. In some cases, the echo cancelation component 820 may include a digital filter (e.g., a finite impulse response (FIR) filter or infinite impulse response (IIR) filter) and an initial set of filter coefficients (e.g., a set of tap values for the FIR or IIR filter) may be provided by beam manager 815 that are mapped to receive beamforming parameters, transmit beamforming parameters, or combinations thereof.

Echo cancelation component 820 may receive a digital input from an A/D converter 830, and provide a digital estimation of an echo signal to a D/A converter 840. The D/A converter 840 may convert the digital estimation of the echo signal to an analog echo estimation signal that is provided to subtracting combiner 825, that may subtract the analog echo estimation signal from an analog baseband signal. The output of the subtracting combiner 825 may be provided to A/D converter 830, which converts the analog baseband signal to a digital signal that is provided to the echo cancelation component 820 and a digital filtering component 835. The digital filtering component 835 may include one or more digital filters (e.g., FIR, IIR filters) that are used to perform out-of-band noise rejection and matched filtering, such as illustrated in FIG. 4. The output of the digital filtering component 835 may be provided to D/A converter 875 for conversion back to an analog baseband signal for upconversion to RF and retransmission.

In this example, a gain control component 885 may provide gain control to LNA(s) 892 and PA driver(s) 895, which may be based on input from beam manager 818, PA transmit power detection component 887 (e.g., couplers), and RSSI measurement component 890, which may each operate as discussed with respect to FIGS. 5 through 7. In some cases, a repeater may be a self-configuring repeater that does not rely on a separate control link to provide beamforming parameters or carrier tracking information. In such cases, the in-band signaling circuitry 845 may be used to determine such control information. In the example of FIG. 8, the in-band signaling circuitry 845 includes a cyclic prefix (CP) removal component 850, a fast Fourier transform (FFT) component 855, a channel estimation component 860, and a demodulator 867.

The in-band signaling circuitry 845 may, in some cases, demodulate one or more SSBs from a base station and derive beamforming parameters from a physical broadcast channel (PBCH) transmission in the SSBs. Further, the in-band signaling circuitry 845 may receive one or more synchronization signals or reference signals (e.g., a primary synchronization signal (PSS), secondary synchronization signal (SSS), tracking reference signal (TRS), phase tracking reference signal (PTRS), or any combinations thereof), which may be used for channel estimation and equalization. Carrier tracking may be provided in a self-configuring repeater using a PLL synthesizer that receives input from a frequency/timing PLL 870 coupled with from FFT component 855 and initial acquisition and tracking information from SSB information provided by the in-band signaling circuitry 845. In other cases where the repeater has a separate control link, the PLL synthesizer 880 may receive initial acquisition and tracking information from the separate control link. Such carrier frequency tracking, and symbol timing acquisition from SSB information, may help to prevent inter-carrier interference (ICI) and spectral regrowth due to re-modulation of leakage terms.

As discussed with reference to FIGS. 2 through 8, various aspects of the present disclosure provide for echo cancelation. In the examples of FIGS. 5 through 8, analog echo cancelation is provided in which an analog representation of an estimated echo signal is subtracted from an analog baseband signal. An example of an analog echo cancelation circuit is discussed with respect to FIG. 9. In other cases, echo cancelation may be performed digitally, and an example of digital echo cancelation is discussed with respect to FIG. 10.

Figure 9:
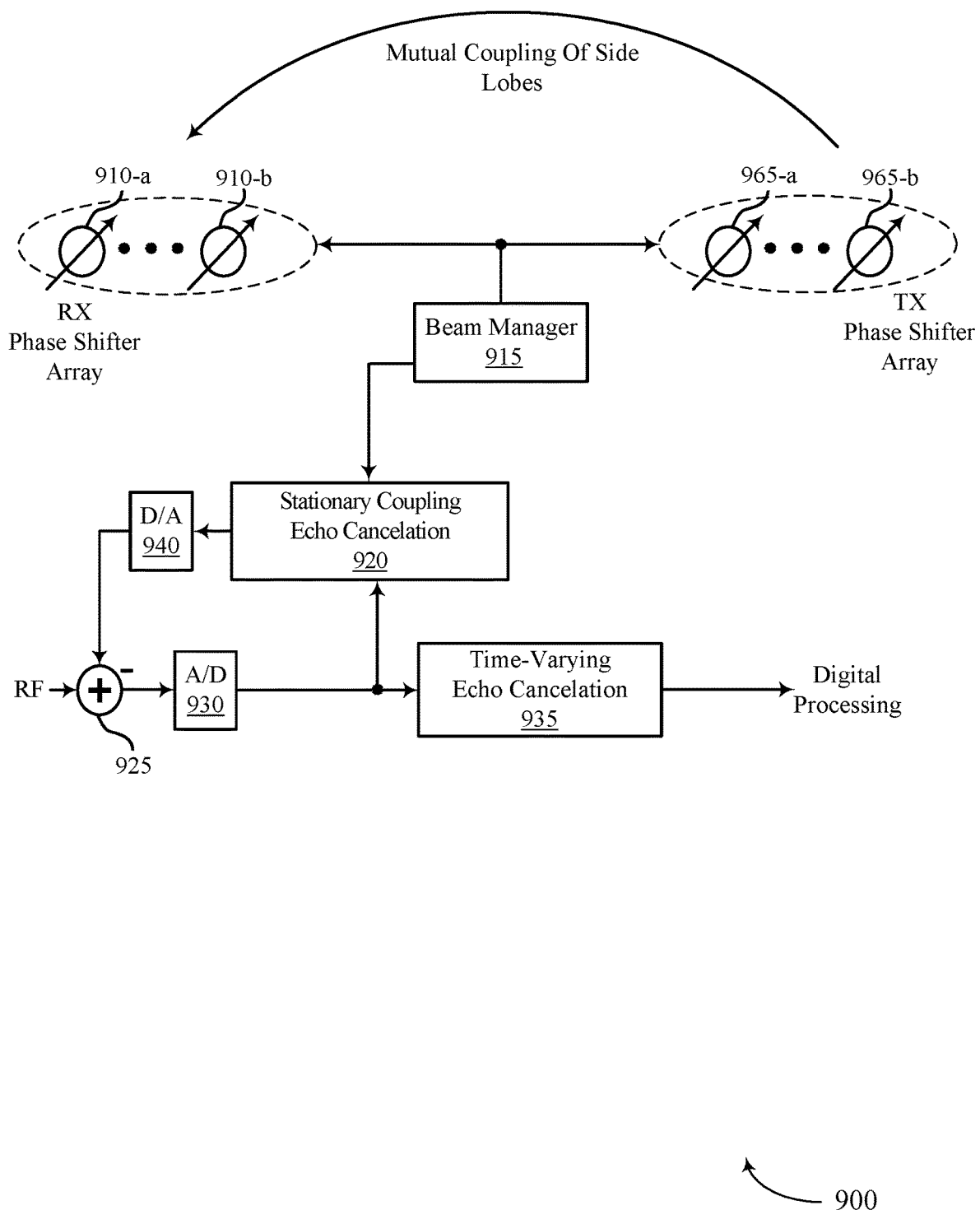
FIG. 9 illustrates an example of an analog echo cancelation circuit that supports beamforming repeaters with digitally assisted interference mitigation in accordance with aspects of the present disclosure.

FIG. 9 illustrates an example of an analog echo cancelation circuit 900 that supports beamforming repeaters with digitally assisted interference mitigation in accordance with aspects of the present disclosure. In some examples, analog echo cancelation circuit 900 may implement aspects of wireless repeaters as discussed herein.

In this example, a receive phase shifter array 910 may include a number of phase shifters 910-a through 910-b, which may be coupled with respective antenna elements. Likewise, a transmit phase shifter array 965 may include a number of phase shifters 965-a through 965-b, which may be coupled with respective antenna elements. A beam manager 915 may control an amount of phase shift applied at each phase shifter according to beamforming parameters that are determined based on an optional control link (e.g., a secondary control link established on FR1) or based on optional in-band signaling circuitry, such as discussed with respect to FIG. 8. Beam manager 915, in this example, may also provide information to a stationary echo cancelation component 920 that may perform filtering to provide echo cancelation. In some cases, the stationary echo cancelation component 920 may include a digital filter (e.g., a finite impulse response (FIR) filter or infinite impulse response (IIR) filter) and an initial set of filter coefficients (e.g., a set of tap values for the FIR or IIR filter) may be provided by beam manager 915 that are mapped to receive beamforming parameters, transmit beamforming parameters, or combinations thereof.

Stationary echo cancelation component 920 may receive a digital input from an A/D converter 930, and provide a digital estimation of an echo signal (i.e., based on the filtering coefficients) to a D/A converter 940. The D/A converter 940 may convert the digital estimation of the echo signal to an analog echo estimation signal that is provided to subtracting combiner 925, that may subtract the analog echo estimation signal from an analog baseband signal. The output of the subtracting combiner 925 may be provided to A/D converter 930, which converts the analog baseband signal to a digital signal that is provided to the stationary echo cancelation component 920 and a time-varying echo cancelation component 935. The time-varying echo cancelation component 935 may include one or more digital filters (e.g., FIR, IIR filters) that are used to perform out-of-band noise rejection and matched filtering, and the like. The output of the time-varying echo cancelation component 935 may be provided other components of a repeater for processing, such as discussed with respect to FIGS. 5 through 8. The stationary echo cancelation component 920, in some cases, may provide echo cancelation for mutual coupling of side lobes, and for stationary clutter interference. The time-varying echo cancelation component 935 may provide cancelation of time-varying clutter echo.

Figure 10:
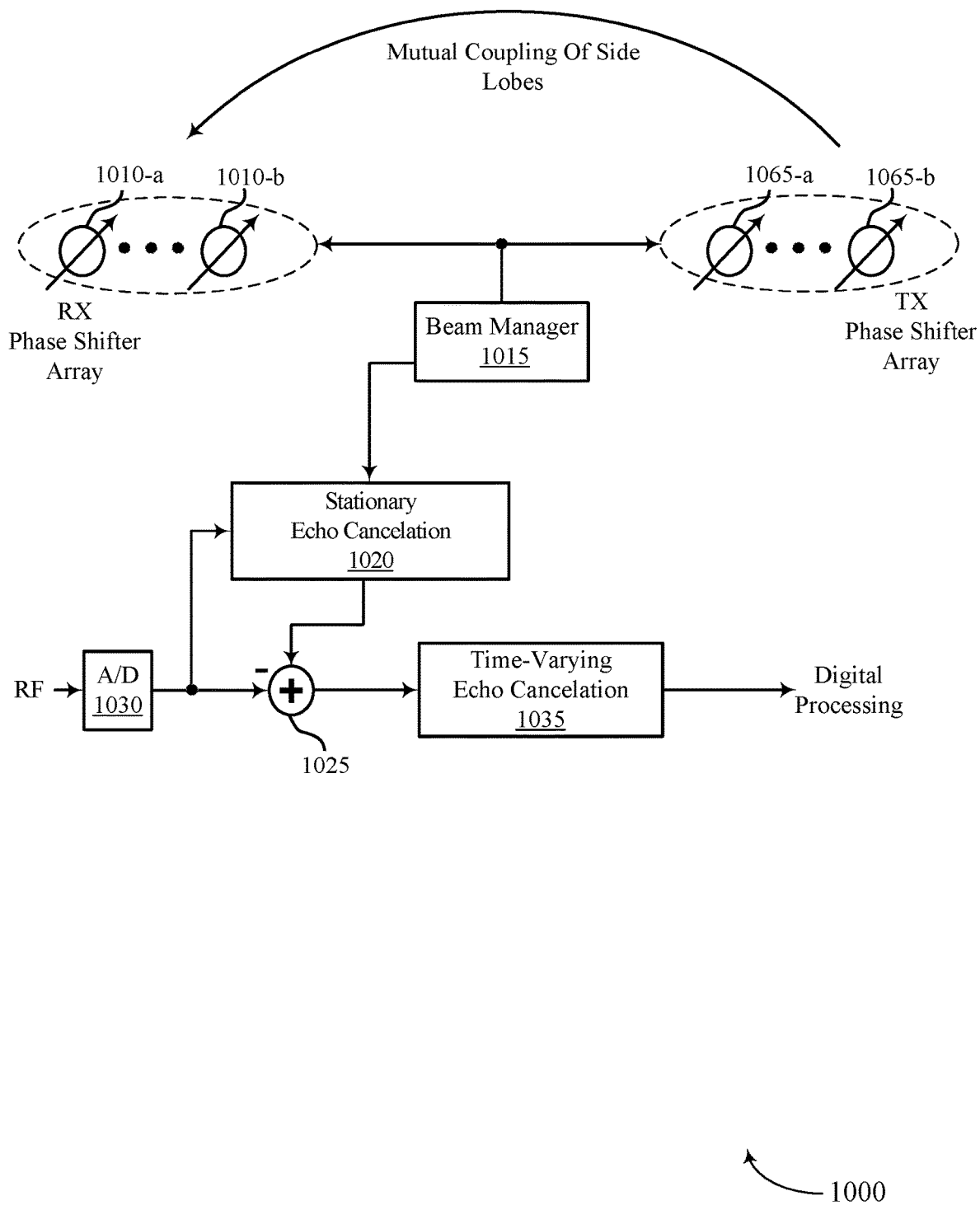
FIG. 10 illustrates an example of a digital echo cancelation circuit that supports beamforming repeaters with digitally assisted interference mitigation in accordance with aspects of the present disclosure.

FIG. 10 illustrates an example of a digital echo cancelation circuit 1000 that supports beamforming repeaters with digitally assisted interference mitigation in accordance with aspects of the present disclosure. In some examples, digital echo cancelation circuit 1000 may implement aspects of wireless repeaters as discussed herein.

In this example, a receive phase shifter array 1010 may include a number of phase shifters 1010-*a* through 1010-*b*, which may be coupled with respective antenna elements. Likewise, a transmit phase shifter array 1065 may include a number of phase shifters 1065-*a* through 1065-*b*, which may be coupled with respective antenna elements. A beam manager 1015 may control an amount of phase shift applied at each phase shifter according to beamforming parameters that are determined based on an optional control link (e.g., a secondary control link established on FR1) or based on optional in-band signaling circuitry, such as discussed with respect to FIG. 8. Beam manager 1015, in this example, may also provide information to a stationary echo cancelation component 1020 that may perform filtering to provide echo cancelation. In some cases, the stationary echo cancelation component 1020 may include a digital filter (e.g., a finite impulse response (FIR) filter or infinite impulse response (IIR) filter) and an initial set of filter coefficients (e.g., a set of tap values for the FIR or IIR filter) may be provided by beam manager 1015 that are mapped to receive beamforming parameters, transmit beamforming parameters, or combinations thereof.

Stationary echo cancelation component 1020 may receive a digital input from an A/D converter 1030, and provide a digital estimation of an echo signal (i.e., based on the filtering coefficients) to a digital subtraction component 1025 that may subtract the digital estimation of the echo signal from the digital output of the A/D converter 1030 to provide a first filtered digital signal. The first filtered digital signal may be provided to a time-varying echo cancelation component 1035. The time-varying echo cancelation component 1035 may include one or more digital filters (e.g., FIR, IIR filters) that are used to perform out-of-band noise rejection and matched filtering, and the like. The output of the time-varying echo cancelation component 1035 may be provided other components of a repeater for processing, such as discussed with respect to FIGS. 5 through 8. The stationary echo cancelation component 1020, in some cases, may provide echo cancelation for mutual coupling of side lobes, and for stationary clutter interference. The time-varying echo cancelation component 1035 may provide cancelation of time-varying clutter echo.

Figure 11:
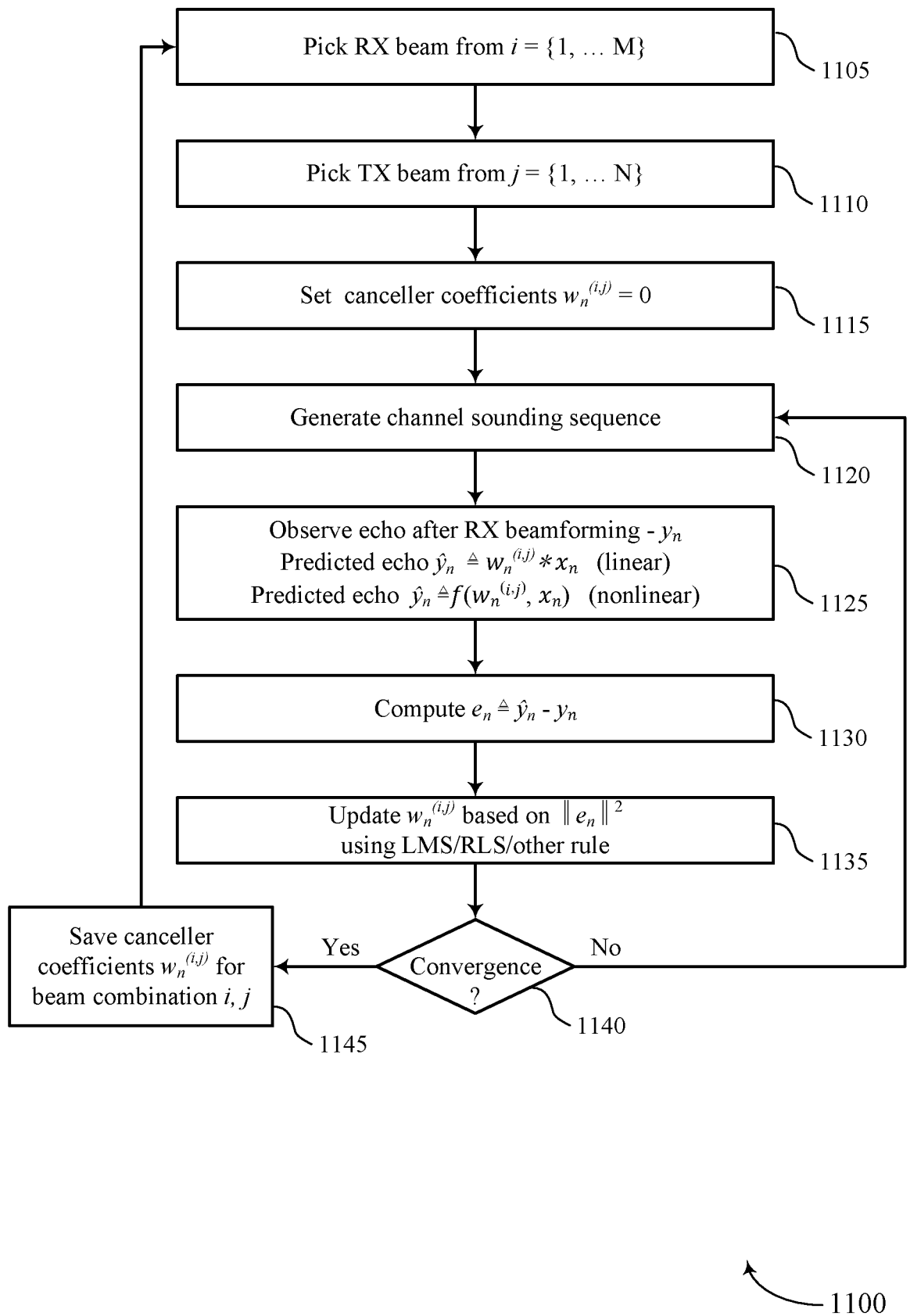
FIG. 11 illustrates an example of a flow chart for filter coefficient determination that supports beamforming repeaters with digitally assisted interference mitigation in accordance with aspects of the present disclosure.

As discussed herein, the beam manager 1015, as well as other examples of beam managers from FIGS. 8 and 9, or beam controllers from FIGS. 2 and 3, may provide a set of filter coefficients to an echo cancelation component to filter out mutual coupling and stationary clutter interference at a repeater. FIG. 11 shows a flow chart for configuring a number of different sets of filter coefficients for different combinations of transmit and receive beamforming parameters, that may then be selected by a repeater based on beamforming parameters used at the repeater.

FIG. 11 illustrates an example of a flow chart for filter coefficient determination 1100 that supports beamforming repeaters with digitally assisted interference mitigation in accordance with aspects of the present disclosure. In some examples, flow chart for filter coefficient determination 1100 may implement aspects of wireless communications system 100. The operations of FIG. 11 may be implemented by a wireless device or its components (e.g., a repeater 140, 205, or 305) as described herein. For example, the operations of FIG. 11 may be performed by a beam manager or beam controller as described with reference to FIG. 2-3, or 8-10. In some examples, a wireless device may execute a set of instructions to control the functional elements of the wireless device to perform the functions described below. Additionally or alternatively, a wireless device may perform aspects of the functions described below using special-purpose hardware.

At 1105, the wireless device may pick a receive beam (i.e., beam i) from a set of available receive beams (e.g., from a set of receive beams having beamforming parameters that are mapped to index values 1 through M). At 1110, the wireless device may pick a transmit beam (i.e., beam j) from a set of available transmit beams (e.g., from a set of transmit beams having beamforming parameters that are mapped to index values 1 through N).

At 1115, the wireless device may set each of the canceller coefficients (i.e., filter coefficients for a digital echo cancelation filter) to zero (i.e., $w_n^{(i,j)}=0$). At 1120, the wireless device may generate a channel sounding sequence. In some cases, the channel sounding sequence may be a predetermined transmission test sequence that the wireless device may provide to PAs of a transmit chain and transmit from the transmit antenna array.

At 1125, the wireless device may measure an echo (i.e., $y_n$) that is received at the receive antenna array that is configured with the selected receive beam beamforming parameters. The wireless device may also determine a predicted echo according to the below linear or non-linear echo prediction functions:

$$\hat{y}_n \triangleq w_n^{(i,j)} * x_n \text{(linear)}$$

$$\hat{y}_n \triangleq f(w_n^{(i,j)}, x_n) \text{(nonlinear)}$$

At 1130, the wireless device may compute an estimated error signal (i.e., $e_n$), which may be the predicted echo minus the measured echo (i.e., $e_n = \hat{y}_n - y_n$). At 1135, the wireless device may update the canceller coefficients (i.e., $w_n^{(i,j)}$) based on an updating rule (e.g., a least mean squares (LMS), recursive least squares (RLS) or other gradient-descent rule).

At 1140, the wireless device may determine if there is convergence, such as based on a magnitude of the estimated error being below a threshold value. If it is determined that there is convergence, the wireless device, at 1145, may save the canceller coefficients for the selected combination of the receive beam and transmit beam, and may repeat the operations starting at 1105 for another combination of receive beam and transmit beam. If it is determined at 1140 that there is not convergence, the operations starting at 1120 may be repeated.

In some cases, such a filter coefficient determination may be performed in a testing environment in which no other signals may be present that may interfere with measurement of echo. In other cases, such filter coefficient determinations may be performed periodically by a repeater after deployment (e.g., to determine filter coefficients to cancel stationary clutter).

Figure 12:
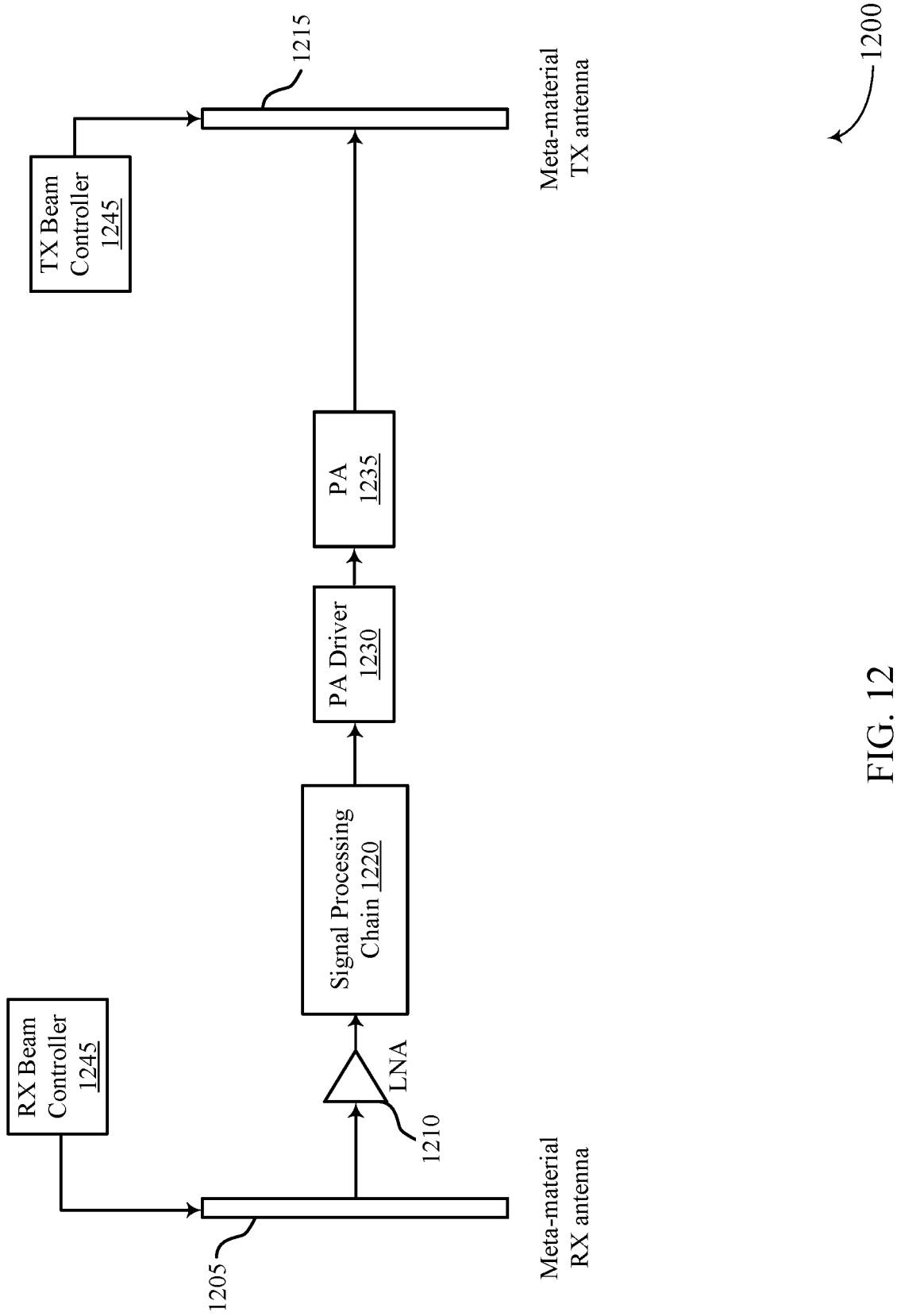
FIG. 12 illustrates an example of a circuit diagram of a signal processing chain using meta-material antennas that supports beamforming repeaters with digitally assisted interference mitigation in accordance with aspects of the present disclosure.

FIG. 12 illustrates an example of a circuit diagram of a signal processing chain using meta-material antennas 1200 that supports beamforming repeaters with digitally assisted interference mitigation in accordance with aspects of the present disclosure. In some examples, circuit diagram of a signal processing chain using meta-material antennas 1200 may implement aspects of wireless communications system 100. In this example, the various components, including transmission lines, LNA 1210, signal processing chain 1220 (e.g., analog components and digital filtering components), PA driver 1230, PA 1235, reception beam controller 1245, and transmission beam controller 1240 between meta-material RX antenna 1205 and meta-material TX antenna 1215 may be implemented as a RFIC.

The meta-material RX antenna 1205 and the meta-material TX antenna 1215 may exhibit negative permittivity and/or permeability, which may yield a negative refractive index. Hence, the antennas may produce a lens capability, which may assist in beamforming. The refractive index of the antennas 1205 and 1215 may be electrically tuned for controlling the beam configuration (e.g., width, direction, angle) by the respective controllers 1240 and 1245. In some cases, the antennas 1205 and 1215 may comprise an array of meta-material antennas, which may allow reduced spacing (e.g., less than $\lambda/2$).

Based on RX beam controller 1245 signals applied to the meta-material RX antenna (or meta-material antenna array), the antenna 1205-a may receive a signal (e.g., based on beam configuration), which is routed to the LNA 1210. Similarly, based on RX beam controller 1245 signals applied to the meta-material TX antenna 1215 (or meta-material antenna array) the antenna 1215 may transmit a signal according to a beam configuration.

If the antennas 1205 and/or 1215 include meta-material antennas configured in an array, the circuit may include a combiner circuit, as described herein to combine pre-processed instances of the signal into a combined signal, and/or a divider circuit to divide the signal to transmit paths corresponding to each meta-material antenna of the meta-material antenna array. The receive/transmit path components may include the LNA 1210, signal processing chain 1220, PA driver 1230, and the PA 1235. In some cases, signal processing chain 1220 may include a dispersion compensation component that may correct the distortion introduced by the meta-material antenna using an RF or analog circuit. In some cases, the signal processing chain may also include a feedback path, similarly as discussed above.

Such meta-materials may be any material of tunable electrical permittivity and/or magnetic permeability, and may be manufactured, for example, using nano-fabrication methods. In some cases, one or more components in an RF chain can be designed with meta-materials, including antennas, switches, phase-shifters, wave-guides, couplers, filters/resonators, oscillators, duplexers/circulators, or any combinations thereof. In some cases, the material refractive index may be a function of permittivity and permeability (e.g., based on Snell's law, from Maxwell's equations). Such materials may be designed for negative permittivity and/or permeability, and hence, have a negative refractive index. In some cases, meta-materials may also be referred to as left-handed materials, Epsilon negative (ENG) materials, double-negative materials, negative refractive index, or Chiral materials. Some use cases of meta-materials may include electrically small antennas (smaller than $\lambda/10$) that retain high efficiency and bandwidth, radio-transparent antennas to allow antenna stacking, limit scatter and mutual coupling, phase-shifters implemented by tuning the dielectric of wave-guides, non-magnetic circulators for duplexing, and the like. Such materials may provide a relatively low insertion loss, may be designed for circuits from sub—6 GHz to several THz, and exhibit low power consumption. In some cases, meta-materials may be used to provide super-resolution lenses that operate below the diffraction limit.

Figure 13:
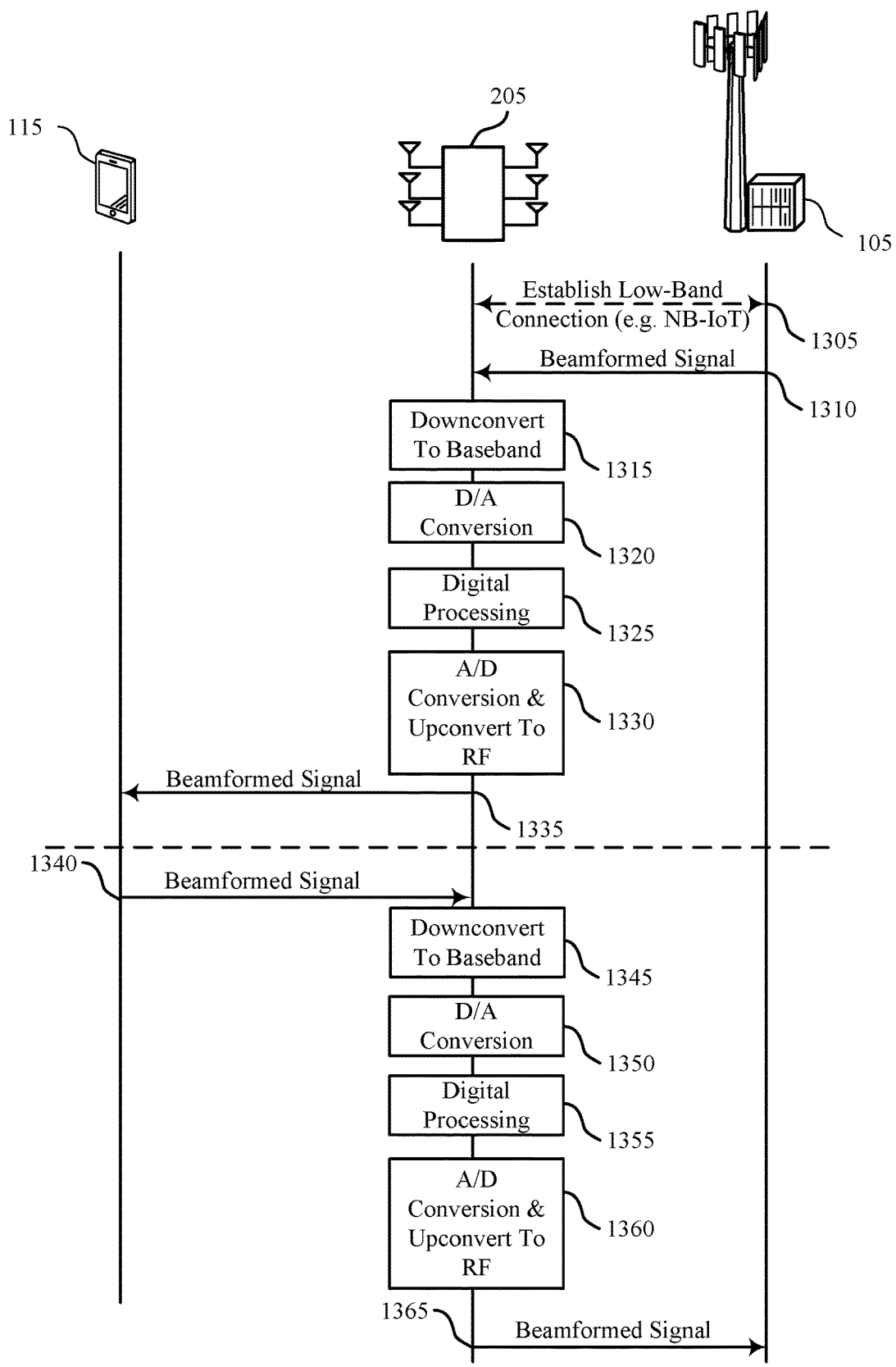
FIG. 13 illustrates an example of a process flow that supports beamforming repeaters with digitally assisted interference mitigation in accordance with aspects of the present disclosure.

FIG. 13 illustrates an example of a process flow 1300 that supports beamforming repeaters with digitally assisted interference mitigation in accordance with aspects of the present disclosure. In some examples, process flow 1300 may implement aspects of wireless communications system 100. The process flow includes UE 115, repeater 205, and base station 105. It should be understood that the features of process flow 1300 may be implemented in uplink and downlink scenarios.

At 1305, base station 105 and repeater 205 may optionally establish a low-band connection. In some cases, the low-band connection may be a side connection that may be used to provide control information regarding beamforming to the repeater. Additionally or alternatively, the low-band connection may provide carrier tracking information that may be used to tune a VCO used for downconverting and upconverting between baseband and RF at the repeater 205. In some cases, the repeater 205 may, additionally or alternatively, establish a low-band connection with UE 115. In some cases, the low-band connection may be a NB-IoT connection using NB-IoT protocols.

At 1310, the base station may transmit a beamformed signal to the repeater 205, which may be received at the repeater 205 via directional beamforming at a first antenna array. The receiver side beamforming may be configured by a beam controller of the repeater 205. At 1315, the repeater 205 may downconvert the beamformed signal to a baseband signal. In some cases, the downconverting may be performed by mixing the received signal with a local oscillator output generated at the repeater 205.

At 1320, the repeater 205 may perform D/A conversion to convert the baseband signal to a digital signal. At 1325, the repeater 205 may perform digital processing on the digital signal. For example, the repeater 205 may filter the digital signal to attenuate undesired frequency components in the signal. In some cases, the filtering may include stationary echo cancelation, time-varying echo cancelation, or combinations thereof. Additionally, in some cases, the filtering may include band-pass filtering about the baseband frequency, and frequencies outside of the band-pass filter may be attenuated.

At 1330, the repeater 205 may perform D/A conversion to convert the digitally processed signal to an analog signal, and may upconvert the analog signal to RF. The upconversion may be performed by mixing the baseband signal with the local oscillator output. At 1335, the repeater 205 retransmits the signal via directional beamforming at a second antenna array of the repeater 205 to the UE 115. The angle or direction may be configured by a beam controller or beam manager of the repeater. The signal processing at repeater 205 may be performed using circuits and techniques as described with respect to FIGS. 2-12.

The repeater 205 may also perform repeating for uplink signals from the UE 115 to the base station 105. For example, at 1340, the UE 115 transmits a signal to the repeater 205, and the repeater 205 receives the signal from the UE 115 via directional beamforming at the second antenna array. At 1345, the repeater 205 may downconvert the beamformed signal to a baseband signal. In some cases, the downconverting may be performed by mixing the received signal with a local oscillator output generated at the repeater 205.

At 1350, the repeater 205 may perform A/D conversion to convert the signal to a digital signal. At 1355, the repeater 205 may perform digital processing (e.g., digital filtering for stationary and time-varying echo) on the signal. At 1360, the repeater 205 may perform A/D conversion and upconvert the processed signal to RF. The upconversion may be performed by mixing the baseband signal with the local oscillator output. At 1365, the repeater 205 retransmits the signal via directional beamforming at the first antenna array of the repeater 205 to the base station 105. The angle or direction may be configured by a beam controller of the repeater. Again, the signal processing at repeater 205 may be performed using circuits and techniques as described with respect to FIGS. 2-12.

Figure 14:
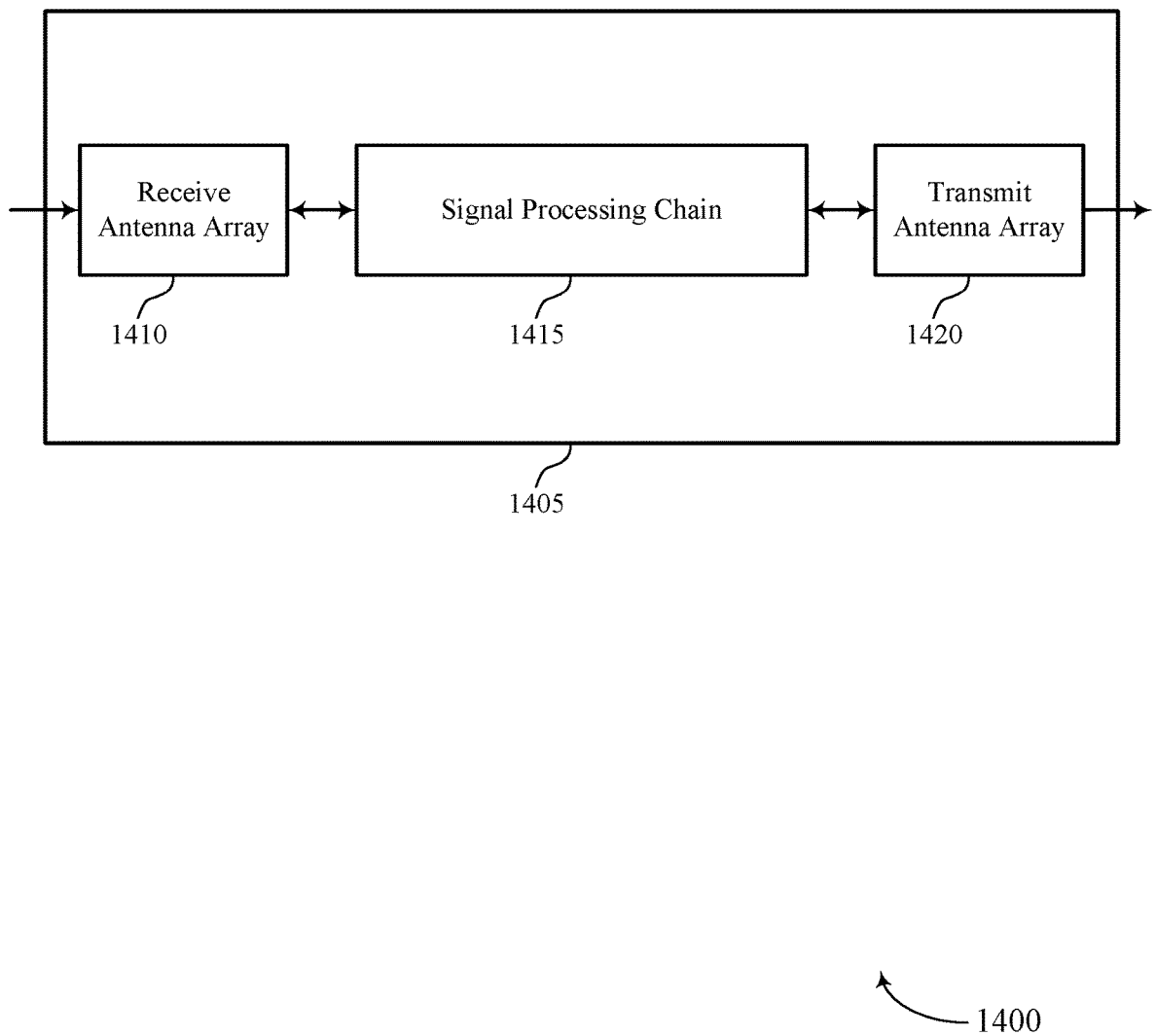
FIGS. 14 and 15 show block diagrams of devices that support beamforming repeaters with digitally assisted interference mitigation in accordance with aspects of the present disclosure.

FIG. 14 shows a block diagram 1400 of a device 1405 as a configurable beamforming repeater in accordance with aspects of the present disclosure. The device 1405 may be an example of aspects of a repeater as described herein. The device 1405 may include a receive antenna array 1410, a signal processing chain 1415, and a transmit antenna array 1420. The device 1405 may also include a processor. Each of these components may be in communication with one another (e.g., via one or more buses).

The receiving antenna array 1410 may receive RF signals and these signals may be passed on to other components of the device 1405. The receiving antenna array 1410 may utilize a set of antennas. The signal processing chain 1415, or its sub-components, may be implemented in hardware, and may include RF/microwave components, such as amplifiers, dividers and combiners. These may be implemented as part of an RF circuit with transistors. Examples of such RF circuits may include monolithic microwave integrated circuits (MMICs).

The signal processing chain 1415, or its sub-components, may be physically located at various positions, including being distributed such that portions of functions are implemented at different physical locations by one or more physical components. In some examples, the signal processing chain 1415, or its sub-components, may be a separate and distinct component in accordance with various aspects of the present disclosure. In some examples, the signal processing chain 1415, or its sub-components, may be combined with one or more other hardware components.

In some cases, the device 1405 may receive a first analog signal at the receive antenna array via directional beamforming using a first set of beamforming parameters, convert the first analog signal to a first digital signal, select, based at least in part on one or more of the first set of beamforming parameters or a second set of beamforming parameters that are to be applied to the transmit antenna array for transmitting a second analog signal, a first set of filter coefficients from plurality of sets of available filter coefficients for a digital filter, filter the first digital signal at the digital filter using the first set of filter coefficients to generate a second digital signal, convert the second digital signal to the second analog signal, and transmit the second analog signal at the transmit antenna array via directional beamforming using the second set of beamforming parameters.

The transmitting antenna array 1420 may transmit signals generated by other components of the device 1405. In some examples, the transmitting antenna array 1420 may be collocated with a receiving antenna array 1410. The transmitting antenna array 1420 may utilize set of antennas.

Figure 15:
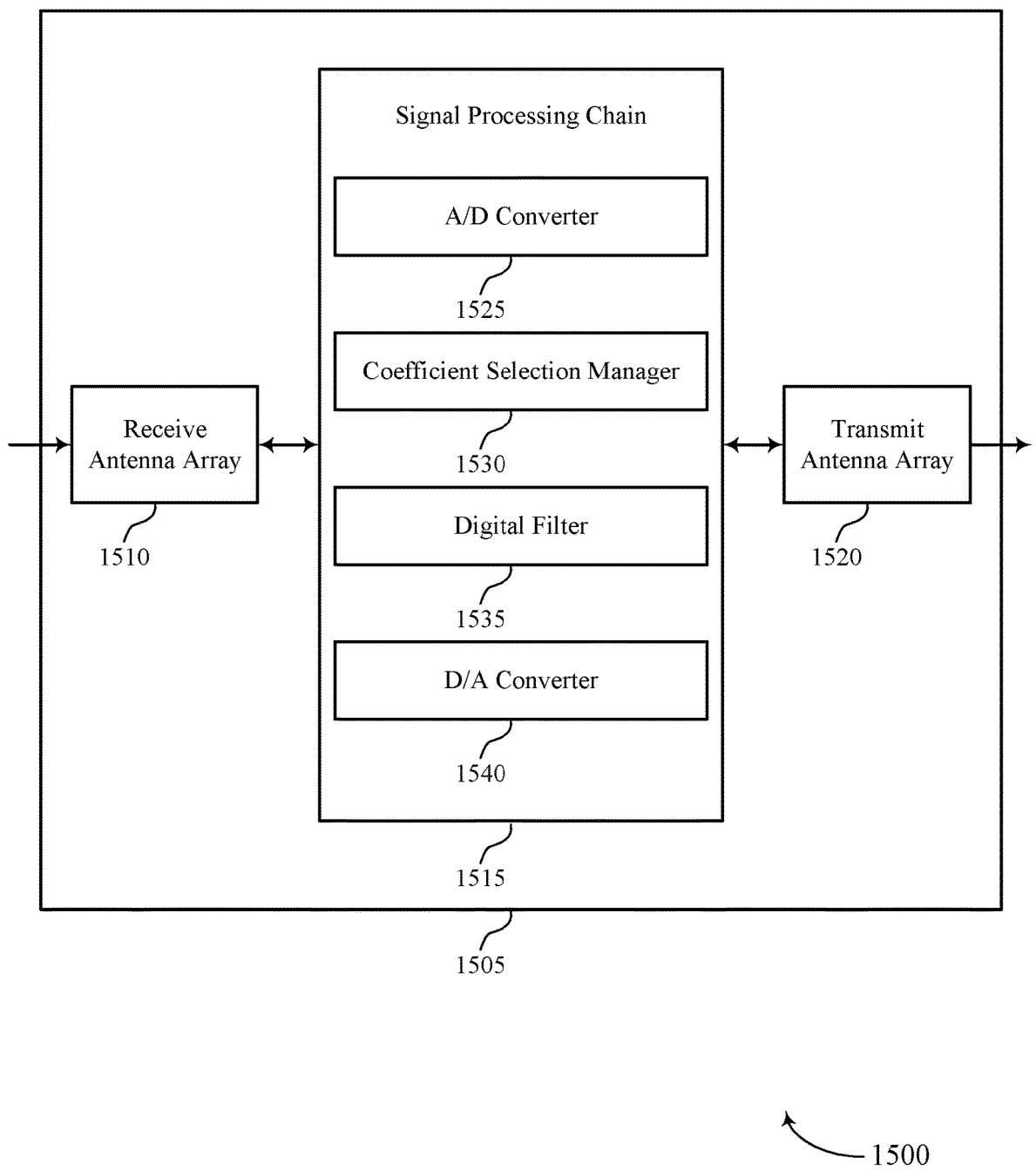

FIG. 15 shows a block diagram 1500 of a device 1505 as a configurable beamforming repeater in accordance with aspects of the present disclosure. The device 1505 may be an example of aspects of a device 1405, or repeater as described herein. The device 1505 may include a receive antenna array 1510, a signal processing chain 1515, and a transmit antenna array 1520.

The receive antenna array 1510 may receive RF signals, and these signals may be passed on to other components of the device 1505. The receive antenna array 1510 may utilize set of antennas. In some cases the receive antenna array 1510 comprises a meta-material antenna or antenna array.

The signal processing chain 1515 may be an example of aspects of the signal processing chain 1415 as described herein. The signal processing chain 1515 may include a A/D converter 1525, a coefficient selection manager 1530, a digital filter 1535, and a D/A converter.

The device 1505 may receive, at the receive antenna array 1510, a signal via directional beamforming and retransmit the signal via directional beamforming at the transmit antenna array 1520. In some cases, the receive antenna array 1510 may receive a first analog signal at a first antenna array via directional beamforming using a first set of beamforming parameters. In some cases, a beam controller or beam manager may adjust the scan angle or direction of components receive antenna array 1510 and transmit antenna array 1520 receiving the signal or retransmitting the signal in order to reduce signal interference. Adjusting the angle or direction of the beamformer may include adjusting, via a beam controller (e.g., beamformer), the directional beamforming for receiving the signal or transmitting the signal in order to reduce signal interference caused by the retransmitting.

The A/D converter 1525 may convert the first analog signal to a first digital signal. The coefficient selection manager 1530 may select, based at least in part on one or more of the first set of beamforming parameters or a second set of beamforming parameters that are to be applied to a second antenna array for transmitting a second analog signal at the wireless repeater, a first set of filter coefficients from plurality of sets of available filter coefficients for the digital filter.

The digital filter 1535 may filter the first digital signal using the first set of filter coefficients to generate a second digital signal. In some cases, the digital filter 1535 may determine, based at least in part on the first set of filter coefficients, an estimated interference signal associated with one or more of mutual coupling of the first antenna array and the second antenna array or stationary clutter. The D/A converter 1540 may convert the second digital signal to the second analog signal.

The transmit antenna array 1520 may transmit the second analog signal at the second antenna array via directional beamforming using the second set of beamforming parameters. In some examples, the transmit antenna array 1520 may be collocated with a receive antenna array 1510 in a transceiver module. The transmit antenna array 1520 may utilize a set of antennas. In some cases the transmit antenna array 1520 comprises a meta-material antenna or antenna array.

Figure 16:
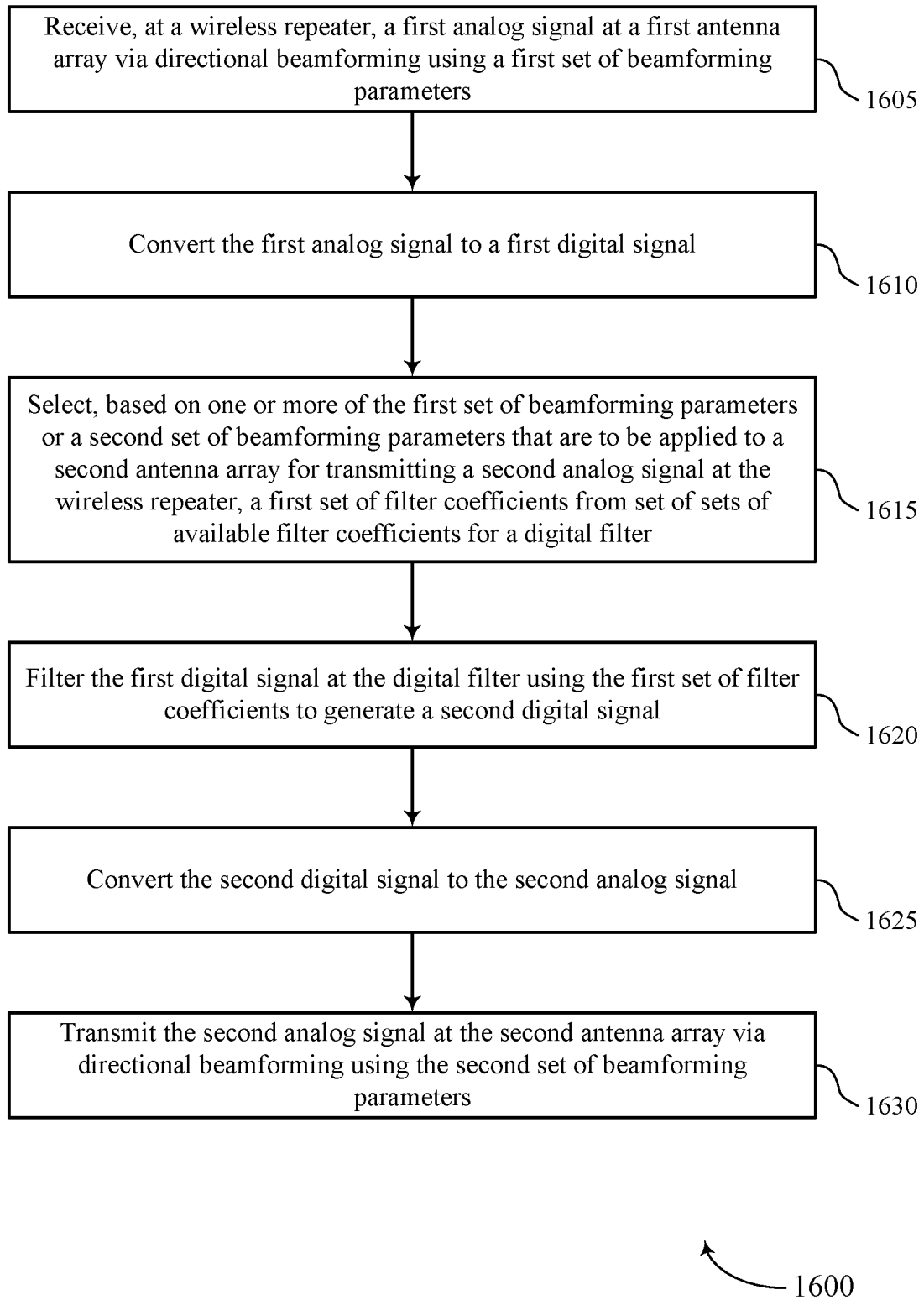
FIGS. 16 through 19 show flowcharts illustrating methods that support beamforming repeaters with digitally assisted interference mitigation in accordance with aspects of the present disclosure.

FIG. 16 shows a flowchart illustrating a method 1600 that supports beamforming repeaters with digitally assisted interference mitigation in accordance with aspects of the present disclosure. The operations of method 1600 may be implemented by a wireless device or its components as described herein. For example, the operations of method 1600 may be performed by a repeater as described with reference to FIGS. 2 through 15. In some examples, a wireless device may execute a set of instructions to control the functional elements of the wireless device to perform the functions described below. Additionally or alternatively, a wireless device may perform aspects of the functions described below using special-purpose hardware.

At 1605, the wireless device may receive a first analog signal at a first antenna array via directional beamforming using a first set of beamforming parameters. The operations of 1605 may be performed according to the methods described herein. In some examples, aspects of the operations of 1605 may be performed by a receiving array as described with reference to FIGS. 2 through 15.

At 1610, the wireless device may convert the first analog signal to a first digital signal. The operations of 1610 may be performed according to the methods described herein. In some examples, aspects of the operations of 1610 may be performed by an A/D converter as described with reference to FIGS. 2 through 15.

At 1615, the wireless device may select, based on one or more of the first set of beamforming parameters or a second set of beamforming parameters that are to be applied to a second antenna array for transmitting a second analog signal at the wireless repeater, a first set of filter coefficients from set of sets of available filter coefficients for a digital filter. The operations of 1615 may be performed according to the methods described herein. In some examples, aspects of the operations of 1615 may be performed by a beam manager, beam controller, or coefficient selection component as described with reference to FIGS. 2 through 15.

At 1620, the wireless device may filter the first digital signal at the digital filter using the first set of filter coefficients to generate a second digital signal. The operations of 1620 may be performed according to the methods described herein. In some examples, aspects of the operations of 1620 may be performed by a digital filter as described with reference to FIGS. 2 through 15.

At 1625, the wireless device may convert the second digital signal to the second analog signal. The operations of 1625 may be performed according to the methods described herein. In some examples, aspects of the operations of 1625 may be performed by a D/A converter as described with reference to FIGS. 2 through 15.

At 1630, the wireless device may transmit the second analog signal at the second antenna array via directional beamforming using the second set of beamforming parameters. The operations of 1630 may be performed according to the methods described herein. In some examples, aspects of the operations of 1630 may be performed by a transmitting array as described with reference to FIGS. 2 through 15.

Figure 17:
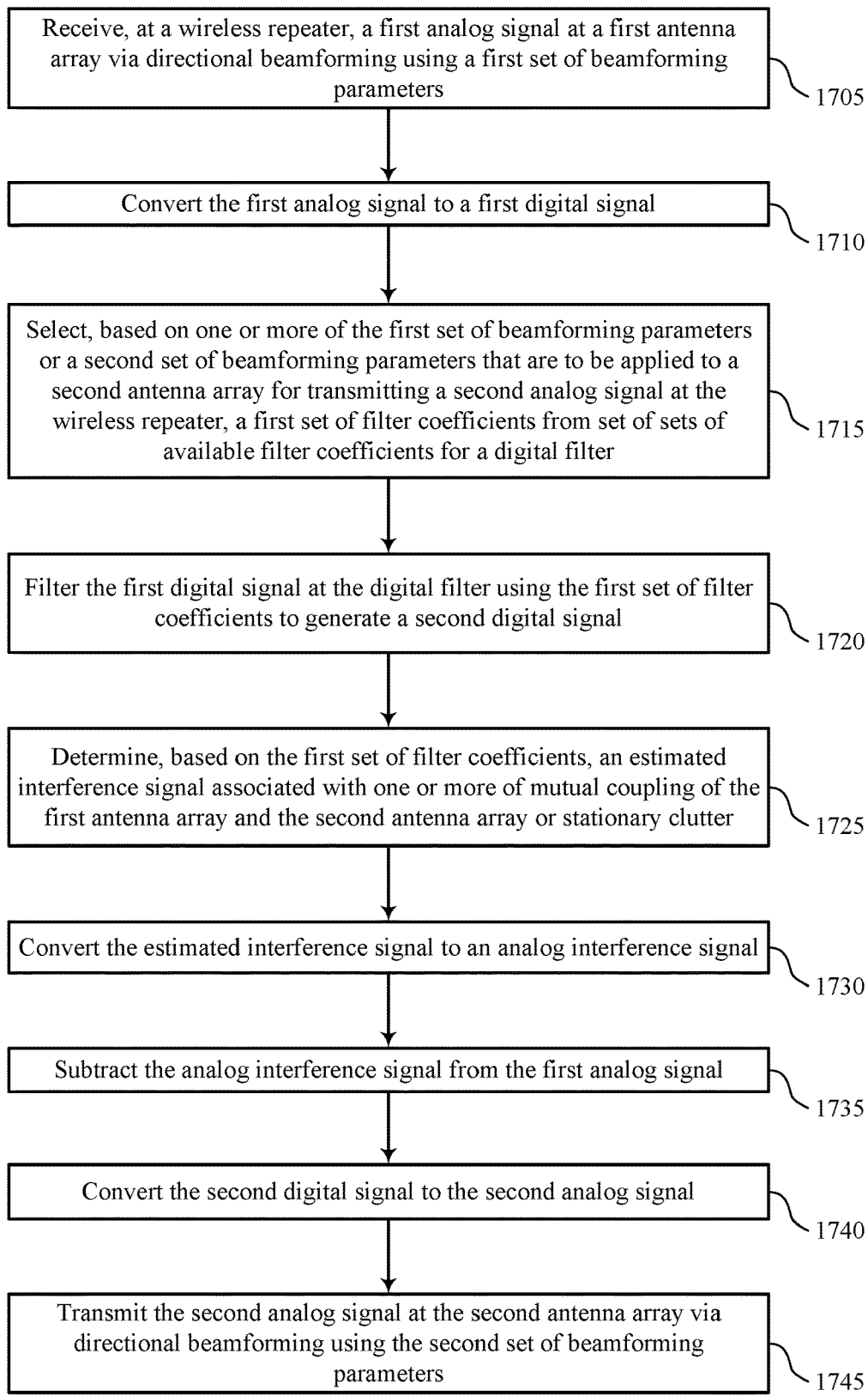

FIG. 17 shows a flowchart illustrating a method 1700 that supports beamforming repeaters with digitally assisted interference mitigation in accordance with aspects of the present disclosure. The operations of method 1700 may be implemented by a wireless device or its components as described herein. For example, the operations of method 1700 may be performed by a repeater as described with reference to FIGS. 2 through 15. In some examples, a wireless device may execute a set of instructions to control the functional elements of the wireless device to perform the functions described below. Additionally or alternatively, a wireless device may perform aspects of the functions described below using special-purpose hardware.

At 1705, the wireless device may receive a first analog signal at a first antenna array via directional beamforming using a first set of beamforming parameters. The operations of 1705 may be performed according to the methods described herein. In some examples, aspects of the operations of 1705 may be performed by a receiving array as described with reference to FIGS. 2 through 15.

At 1710, the wireless device may convert the first analog signal to a first digital signal. The operations of 1710 may be performed according to the methods described herein. In some examples, aspects of the operations of 1710 may be performed by an A/D converter as described with reference to FIGS. 2 through 15.

At 1715, the wireless device may select, based on one or more of the first set of beamforming parameters or a second set of beamforming parameters that are to be applied to a second antenna array for transmitting a second analog signal at the wireless repeater, a first set of filter coefficients from set of sets of available filter coefficients for a digital filter. The operations of 1715 may be performed according to the methods described herein. In some examples, aspects of the operations of 1715 may be performed by a beam controller, beam manager, or coefficient selection component as described with reference to FIGS. 2 through 15.

At 1720, the wireless device may filter the first digital signal at the digital filter using the first set of filter coefficients to generate a second digital signal. The operations of 1720 may be performed according to the methods described herein. In some examples, aspects of the operations of 1720 may be performed by a digital filter as described with reference to FIGS. 2 through 15.

At 1725, the wireless device may determine, based on the first set of filter coefficients, an estimated interference signal associated with one or more of mutual coupling of the first antenna array and the second antenna array or stationary clutter. The operations of 1725 may be performed according to the methods described herein. In some examples, aspects of the operations of 1725 may be performed by a digital processing and control component, an echo cancelation component, or an interference estimation component as described with reference to FIGS. 2 through 15.

At 1730, the wireless device may convert the estimated interference signal to an analog interference signal. The operations of 1730 may be performed according to the methods described herein. In some examples, aspects of the operations of 1730 may be performed by a D/A converter as described with reference to FIGS. 2 through 15.

At 1735, the wireless device may subtract the analog interference signal from the first analog signal. The operations of 1735 may be performed according to the methods described herein. In some examples, aspects of the operations of 1735 may be performed by a subtracting combiner as described with reference to FIGS. 2 through 15.

At 1740, the wireless device may convert the second digital signal to the second analog signal. The operations of 1740 may be performed according to the methods described herein. In some examples, aspects of the operations of 1740 may be performed by a D/A converter as described with reference to FIGS. 2 through 15.

At 1745, the wireless device may transmit the second analog signal at the second antenna array via directional beamforming using the second set of beamforming parameters. The operations of 1745 may be performed according to the methods described herein. In some examples, aspects of the operations of 1745 may be performed by a transmitting array as described with reference to FIGS. 2 through 15.

Figure 18:
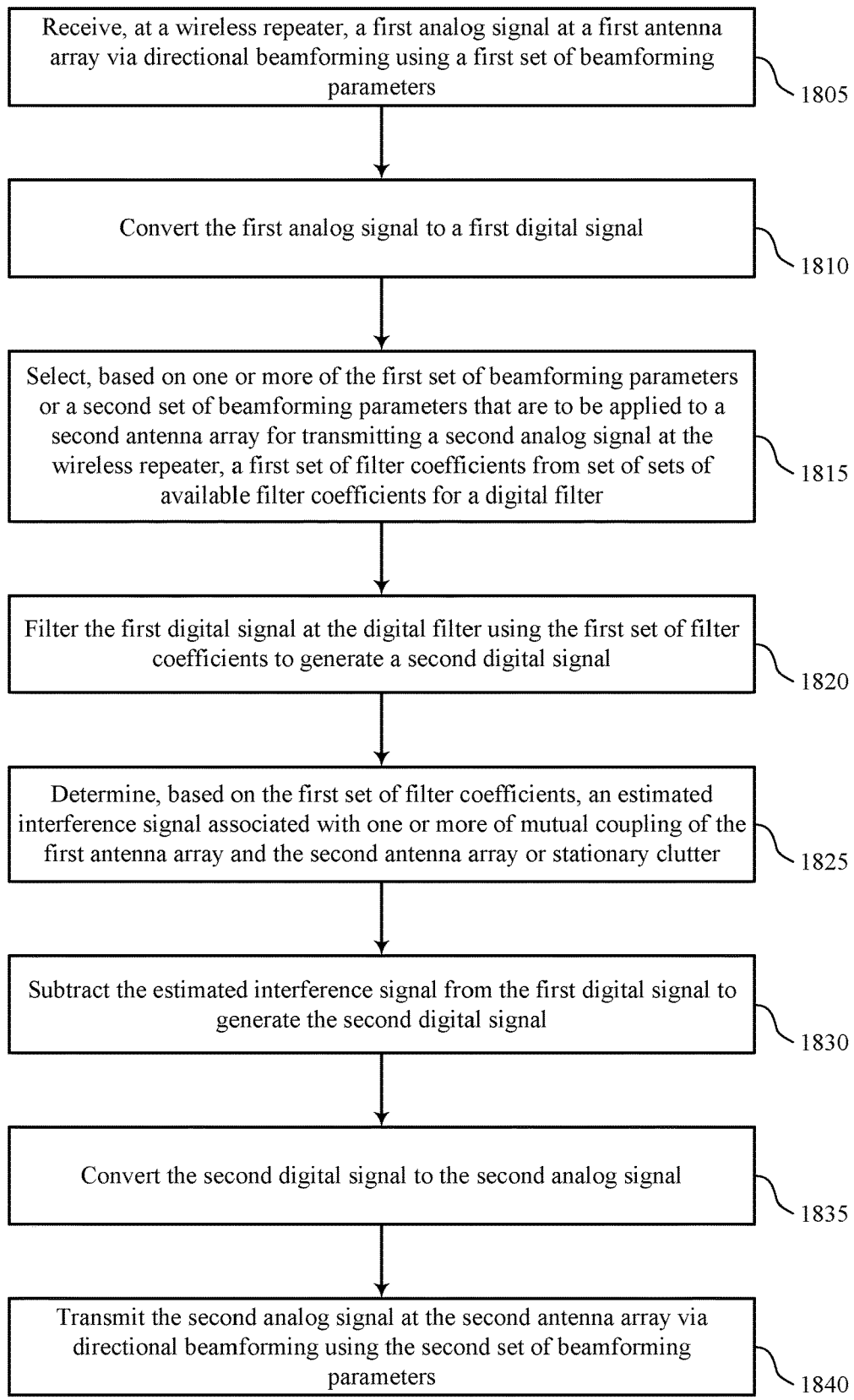

FIG. 18 shows a flowchart illustrating a method 1800 that supports beamforming repeaters with digitally assisted interference mitigation in accordance with aspects of the present disclosure. The operations of method 1800 may be implemented by a wireless device or its components as described herein. For example, the operations of method 1800 may be performed by a repeater as described with reference to FIGS. 2 through 15. In some examples, a wireless device may execute a set of instructions to control the functional elements of the wireless device to perform the functions described below. Additionally or alternatively, a wireless device may perform aspects of the functions described below using special-purpose hardware.

At 1805, the wireless device may receive a first analog signal at a first antenna array via directional beamforming using a first set of beamforming parameters. The operations of 1805 may be performed according to the methods described herein. In some examples, aspects of the operations of 1805 may be performed by a receiving array as described with reference to FIGS. 2 through 15.

At 1810, the wireless device may convert the first analog signal to a first digital signal. The operations of 1810 may be performed according to the methods described herein. In some examples, aspects of the operations of 1810 may be performed by an A/D converter as described with reference to FIGS. 2 through 15.

At 1815, the wireless device may select, based on one or more of the first set of beamforming parameters or a second set of beamforming parameters that are to be applied to a second antenna array for transmitting a second analog signal at the wireless repeater, a first set of filter coefficients from set of sets of available filter coefficients for a digital filter. The operations of 1815 may be performed according to the methods described herein. In some examples, aspects of the operations of 1815 may be performed by a beam manager, beam controller, or coefficient selection manager as described with reference to FIGS. 2 through 15.

At 1820, the wireless device may filter the first digital signal at the digital filter using the first set of filter coefficients to generate a second digital signal. The operations of 1820 may be performed according to the methods described herein. In some examples, aspects of the operations of 1820 may be performed by a digital processing and control component or digital filter as described with reference to FIGS. 2 through 15.

At 1825, the wireless device may determine, based on the first set of filter coefficients, an estimated interference signal associated with one or more of mutual coupling of the first antenna array and the second antenna array or stationary clutter. The operations of 1825 may be performed according to the methods described herein. In some examples, aspects of the operations of 1825 may be performed by a digital processing and control component or an interference estimation component as described with reference to FIGS. 2 through 15.

At 1830, the wireless device may subtract the estimated interference signal from the first digital signal to generate the second digital signal. The operations of 1830 may be performed according to the methods described herein. In some examples, aspects of the operations of 1830 may be performed by digital processing and control component or a digital filter as described with reference to FIGS. 2 through 15.

At 1835, the wireless device may convert the second digital signal to the second analog signal. The operations of 1835 may be performed according to the methods described herein. In some examples, aspects of the operations of 1835 may be performed by a D/A converter as described with reference to FIGS. 2 through 15.

At 1840, the wireless device may transmit the second analog signal at the second antenna array via directional beamforming using the second set of beamforming parameters. The operations of 1840 may be performed according to the methods described herein. In some examples, aspects of the operations of 1840 may be performed by a transmitting array as described with reference to FIGS. 2 through 15.

Figure 19:
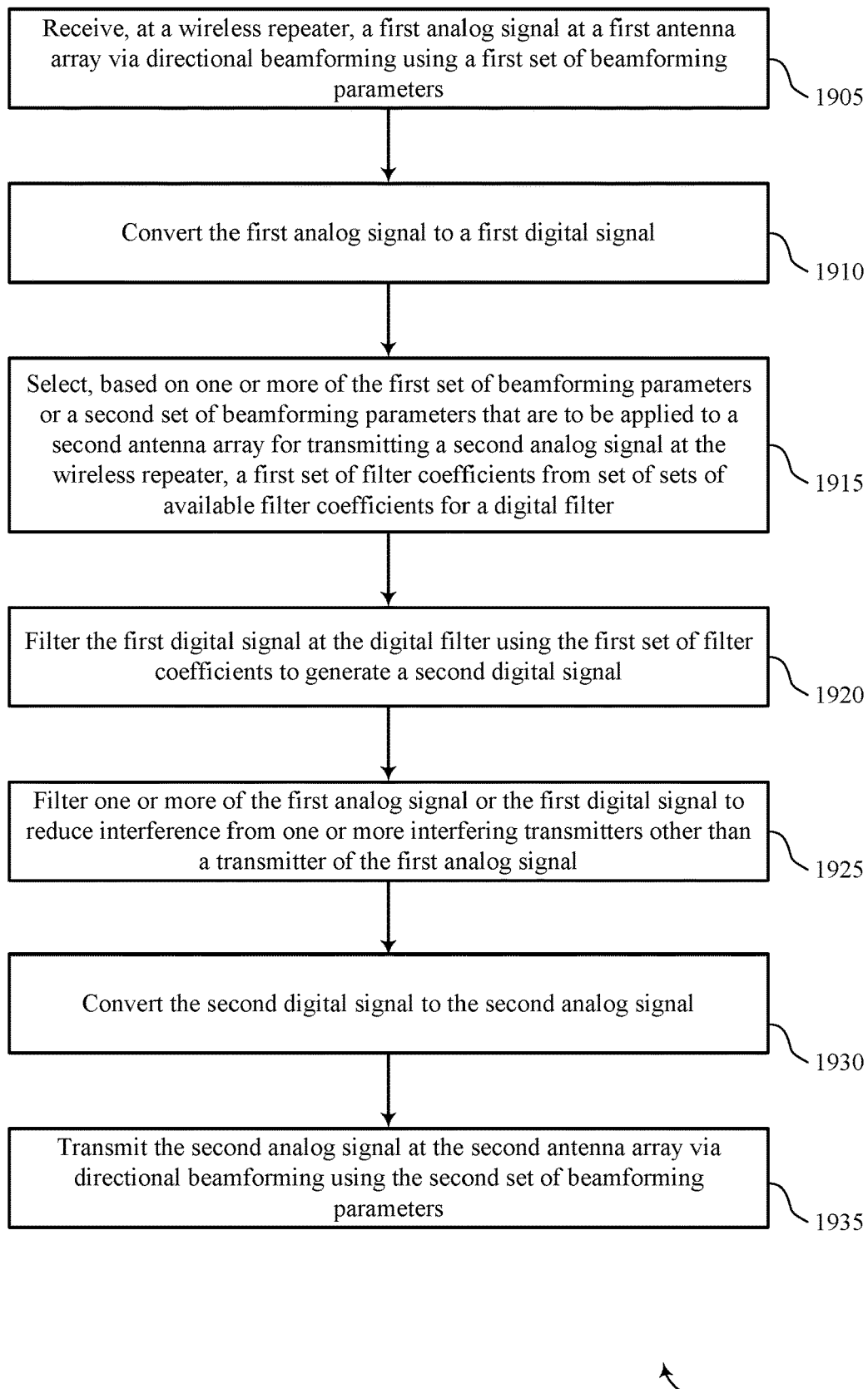

FIG. 19 shows a flowchart illustrating a method 1900 that supports beamforming repeaters with digitally assisted interference mitigation in accordance with aspects of the present disclosure. The operations of method 1900 may be implemented by a wireless device or its components as described herein. For example, the operations of method 1900 may be performed by a repeater as described with reference to FIGS. 2 through 15. In some examples, a wireless device may execute a set of instructions to control the functional elements of the wireless device to perform the functions described below. Additionally or alternatively, a wireless device may perform aspects of the functions described below using special-purpose hardware.

At 1905, the wireless device may receive a first analog signal at a first antenna array via directional beamforming using a first set of beamforming parameters. The operations of 1905 may be performed according to the methods described herein. In some examples, aspects of the operations of 1905 may be performed by a receiving array as described with reference to FIGS. 2 through 15.

At 1910, the wireless device may convert the first analog signal to a first digital signal. The operations of 1910 may be performed according to the methods described herein. In some examples, aspects of the operations of 1910 may be performed by an A/D converter as described with reference to FIGS. 2 through 15.

At 1915, the wireless device may select, based on one or more of the first set of beamforming parameters or a second set of beamforming parameters that are to be applied to a second antenna array for transmitting a second analog signal at the wireless repeater, a first set of filter coefficients from set of sets of available filter coefficients for a digital filter. The operations of 1915 may be performed according to the methods described herein. In some examples, aspects of the operations of 1915 may be performed by a beam manager, beam controller, or coefficient selection manager as described with reference to FIGS. 2 through 15.

At 1920, the wireless device may filter the first digital signal at the digital filter using the first set of filter coefficients to generate a second digital signal. The operations of 1920 may be performed according to the methods described herein. In some examples, aspects of the operations of 1920 may be performed by a digital processing and control component or digital filter as described with reference to FIGS. 2 through 15.

At 1925, the wireless device may filter one or more of the first analog signal or the first digital signal to reduce interference from one or more interfering transmitters other than a transmitter of the first analog signal. The operations of 1925 may be performed according to the methods described herein. In some examples, aspects of the operations of 1925 may be performed by a digital processing and control component, digital filter, or time-varying echo cancelation component as described with reference to FIGS. 2 through 15. In some cases, the filtering to reduce interference from the one or more interfering transmitters includes one or more of intermediate frequency filtering, analog filtering at down-conversion of the first analog signal to a baseband signal, or any combinations thereof.

At 1930, the wireless device may convert the second digital signal to the second analog signal. The operations of 1930 may be performed according to the methods described herein. In some examples, aspects of the operations of 1930 may be performed by a D/A converter as described with reference to FIGS. 2 through 12.

At 1935, the wireless device may transmit the second analog signal at the second antenna array via directional beamforming using the second set of beamforming parameters. The operations of 1935 may be performed according to the methods described herein. In some examples, aspects of the operations of 1935 may be performed by a transmitting array as described with reference to FIGS. 2 through 15.

It should be noted that the methods described herein describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1×, 1 X, etc. IS-856 (TIA-856) is commonly referred to as CDMA2000 1×EV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned herein as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs with service subscriptions with the network provider. A small cell may be associated with a lower-powered base station, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA, or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include random-access memory (RAM), read-only memory (ROM), electrically erasable programmable ROM (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
   receiving, at a wireless repeater, a first analog signal at a first antenna array via directional beamforming using a first set of beamforming parameters;
   converting the first analog signal to a first digital signal;
   selecting, based at least in part on one or more of the first set of beamforming parameters or a second set of beamforming parameters that are to be applied to a second antenna array for transmitting a second analog signal at the wireless repeater, a first set of filter coefficients from plurality of sets of available filter coefficients for a digital filter;
   filtering the first digital signal at the digital filter using the first set of filter coefficients to generate a second digital signal;
   converting the second digital signal to the second analog signal; and
   transmitting the second analog signal at the second antenna array via directional beamforming using the second set of beamforming parameters.

2. The method of claim 1, wherein the filtering the first digital signal further comprises:
   determining, based at least in part on the first set of filter coefficients, an estimated interference signal associated with one or more of mutual coupling of the first antenna array and the second antenna array or stationary clutter; and
   generating the second digital signal based at least in part on the estimated interference signal.

3. The method of claim 2, wherein the first set of filter coefficients are predetermined coefficients that are selected based on a combination of the first set of beamforming parameters and the second set of beamforming parameters.

4. The method of claim 3, wherein each set of filter coefficients of the plurality of sets of available filter coefficients are determined based at least in part on a measurement of mutual coupling of the first antenna array and the second antenna array for an associated combination of beamforming parameters of the first antenna array and the second antenna array.

5. The method of claim 4, further comprising:
   performing a calibration procedure to measure mutual coupling for each of a plurality of combinations of beamforming parameters of the first antenna array and the second antenna array, wherein the calibration procedure is performed in initial testing of the wireless repeater, in periodic off-line calibrations of the wireless repeaters, or combinations thereof.

6. The method of claim 1, wherein the filtering the first digital signal further comprises:
   dynamically filtering time-varying interference from the first digital signal using one or more of a finite impulse response (FIR) filter, an infinite impulse response (IIR) filter, a non-linear filter, or any combinations thereof.

7. The method of claim 1, wherein the filtering the first digital signal further comprises:
   determining, based at least in part on the first set of filter coefficients, an estimated interference signal associated with one or more of mutual coupling of the first antenna array and the second antenna array or stationary clutter;
   converting the estimated interference signal to an analog interference signal; and
   subtracting the analog interference signal from the first analog signal.

8. The method of claim 1, wherein the filtering the first digital signal further comprises:
   determining, based at least in part on the first set of filter coefficients, an estimated interference signal associated with one or more of mutual coupling of the first antenna array and the second antenna array or stationary clutter; and subtracting the estimated interference signal from the first digital signal to generate the second digital signal.

9. The method of claim 1, wherein one or more of the first set of beamforming parameters or the second set of beamforming parameters are determined based at least in part on control information received via a control link with a transmitter of the first analog signal, and wherein the control link is separate from the first analog signal.

10. The method of claim 1, further comprising:
demodulating the first analog signal to obtain one or more reference signals or synchronization signal blocks transmitted via the first analog signal; and
determining one or more of the first set of beamforming parameters or the second set of beamforming parameters based at least in part on the one or more reference signals or synchronization signal blocks.

11. The method of claim 1, further comprising:
down-converting the first analog signal to a baseband signal using a baseband frequency generated by a local oscillator, and wherein an output of the local oscillator is generated by a voltage controlled oscillator that is tuned based at least in part on an output of a carrier tracking component that provides carrier tracking of a first frequency of the first analog signal.

12. The method of claim 11, further comprising:
demodulating the first analog signal to obtain one or more reference signals or synchronization signal blocks transmitted via the first analog signal; and
determining the first frequency at the carrier tracking component based at least in part on the one or more reference signals or synchronization signal blocks.

13. The method of claim 1, wherein:
the receiving the first analog signal further comprises:
pre-processing the first analog signal via respective low noise amplifiers and phase shifters that correspond to each of a plurality of antenna elements of the first antenna array based at least in part on the first set of beamforming parameters, the pre-processing resulting in a plurality of pre-processed instances of the first analog signal;
combining, via a combiner circuit of the wireless repeater, the plurality of pre-processed instances of the first analog signal into a combined signal; and
wherein the transmitting the second analog signal further comprises:
dividing, via a divider circuit of the wireless repeater, the second analog signal to a plurality of transmit paths corresponding to a plurality of antenna elements of the second antenna array, each transmit path including at least a phase shifter, a power amplifier driver and a power amplifier;
phase shifting the second analog signal at one or more of the transmit paths at a respective phase shifter based at least in part on the second set of beamforming parameters; and
amplifying the second analog signal at one or more of the transmit paths at a respective power amplifier driver and power amplifier based at least in part on the second set of beamforming parameters.

14. The method of claim 1, wherein:
the receiving the first analog signal further comprises:
phase shifting the first analog signal via respective phase shifters that correspond to each of a plurality of antenna elements of the first antenna array to generate a plurality of phase shifted instances of the first analog signal, the phase shifting based at least in part on the first set of beamforming parameters;
combining, via a combiner circuit of the wireless repeater, the plurality of phase shifted instances of the first analog signal into a combined signal;
amplifying, via a low noise amplifier of the first antenna array, the combined signal; and
wherein the transmitting the second analog signal further comprises:
amplifying the second analog signal using a power amplifier driver and a power amplifier of the wireless repeater to generate an amplified second signal;
dividing, via a divider circuit of the wireless repeater, the amplified second signal to a plurality of transmit paths corresponding to a plurality of antenna elements of the second antenna array, each transmit path including at least a phase shifter; and
phase shifting the amplified second signal at one or more of the plurality of transmit paths based at least in part on the second set of beamforming parameters.

15. The method of claim 1, wherein:
the receiving the first analog signal comprises downconverting the first analog signal to a baseband signal using a zero intermediate frequency (ZIF) architecture, low-IF architecture, or a super-heterodyne architecture; and
wherein the transmitting the second analog signal comprises upconverting the second analog signal from baseband using a ZIF architecture, low-IF architecture, or a super-heterodyne architecture.

16. The method of claim 1, wherein the filtering further comprises:
downconverting the first analog signal to an intermediate frequency signal; and
providing the intermediate frequency signal to a surface acoustic wave (SAW) filter, bulk acoustic wave (BAW) filter, a film bulk acoustic wave resonator (FBAR) filter, or any combinations thereof.

17. The method of claim 1, further comprising:
monitoring an output of at least one power amplifier of a signal processing chain at the second antenna array; and
adjusting, based at least in part on the output, one or more of a gain of the at least one power amplifier or a gain of at least one low noise amplifier coupled with the first antenna array.

18. An apparatus for wireless communication, comprising:
a processor,
memory in electronic communication with the processor; and
instructions stored in the memory and executable by the processor to cause the apparatus to:
receive, at a wireless repeater, a first analog signal at a first antenna array via directional beamforming using a first set of beamforming parameters;
convert the first analog signal to a first digital signal;
select, based at least in part on one or more of the first set of beamforming parameters or a second set of beamforming parameters that are to be applied to a second antenna array for transmitting a second analog signal at the wireless repeater, a first set of filter coefficients from plurality of sets of available filter coefficients for a digital filter;
filter the first digital signal at the digital filter using the first set of filter coefficients to generate a second digital signal;

convert the second digital signal to the second analog signal; and transmit the second analog signal at the second antenna array via directional beamforming using the second set of beamforming parameters.

19. The apparatus of claim 18, wherein the instructions are further executable by the processor to cause the apparatus to:

determine, based at least in part on the first set of filter coefficients, an estimated interference signal associated with one or more of mutual coupling of the first antenna array and the second antenna array or stationary clutter; and generate the second digital signal based at least in part on the estimated interference signal.

20. The apparatus of claim 19, wherein the first set of filter coefficients are predetermined coefficients that are selected based on a combination of the first set of beamforming parameters and the second set of beamforming parameters.

21. The apparatus of claim 20, wherein each set of filter coefficients of the plurality of sets of available filter coefficients are determined based at least in part on a measurement of mutual coupling of the first antenna array and the second antenna array for an associated combination of beamforming parameters of the first antenna array and the second antenna array.

22. The apparatus of claim 21, wherein the instructions are further executable by the processor to cause the apparatus to:

perform a calibration procedure to measure mutual coupling for each of a plurality of combinations of beamforming parameters of the first antenna array and the second antenna array, wherein the calibration procedure is performed in initial testing of the wireless repeater, in periodic off-line calibrations of the wireless repeaters, or combinations thereof.

23. The apparatus of claim 18, wherein the instructions are further executable by the processor to cause the apparatus to:

dynamically filter time-varying interference from the first digital signal using one or more of a finite impulse response (FIR) filter, an infinite impulse response (IIR) filter, a non-linear filter, or any combinations thereof.

24. The apparatus of claim 18, wherein the instructions are further executable by the processor to cause the apparatus to:

determine, based at least in part on the first set of filter coefficients, an estimated interference signal associated with one or more of mutual coupling of the first antenna array and the second antenna array or stationary clutter;

convert the estimated interference signal to an analog interference signal; and subtract the analog interference signal from the first analog signal.

25. The apparatus of claim 18, wherein the instructions are further executable by the processor to cause the apparatus to:

determine, based at least in part on the first set of filter coefficients, an estimated interference signal associated with one or more of mutual coupling of the first antenna array and the second antenna array or stationary clutter; and subtract the estimated interference signal from the first digital signal to generate the second digital signal.

26. The apparatus of claim 18, wherein the instructions are further executable by the processor to cause the apparatus to:

demodulate the first analog signal to obtain one or more reference signals or synchronization signal blocks transmitted via the first analog signal; and determine one or more of the first set of beamforming parameters or the second set of beamforming parameters based at least in part on the one or more reference signals or synchronization signal blocks.

27. The apparatus of claim 18, wherein the instructions are further executable by the processor to cause the apparatus to:

down-convert the first analog signal to a baseband signal using a baseband frequency generated by a local oscillator, and wherein an output of the local oscillator is generated by a voltage controlled oscillator that is tuned based at least in part on an output of a carrier tracking component that provides carrier tracking of a first frequency of the first analog signal.

28. The apparatus of claim 27, wherein the instructions are further executable by the processor to cause the apparatus to:

demodulate the first analog signal to obtain one or more reference signals or synchronization signal blocks transmitted via the first analog signal; and determine the first frequency at the carrier tracking component based at least in part on the one or more reference signals or synchronization signal blocks.

29. An apparatus for wireless communication, comprising:

means for receiving, at a wireless repeater, a first analog signal at a first antenna array via directional beamforming using a first set of beamforming parameters;

means for converting the first analog signal to a first digital signal;

means for selecting, based at least in part on one or more of the first set of beamforming parameters or a second set of beamforming parameters that are to be applied to a second antenna array for transmitting a second analog signal at the wireless repeater, a first set of filter coefficients from plurality of sets of available filter coefficients for a digital filter;

means for filtering the first digital signal at the digital filter using the first set of filter coefficients to generate a second digital signal;

means for converting the second digital signal to the second analog signal; and means for transmitting the second analog signal at the second antenna array via directional beamforming using the second set of beamforming parameters.

30. A non-transitory computer-readable medium storing code for wireless communication, the code comprising instructions executable by a processor to:

receive, at a wireless repeater, a first analog signal at a first antenna array via directional beamforming using a first set of beamforming parameters;

convert the first analog signal to a first digital signal;

select, based at least in part on one or more of the first set of beamforming parameters or a second set of beamforming parameters that are to be applied to a second antenna array for transmitting a second analog signal at the wireless repeater, a first set of filter coefficients from plurality of sets of available filter coefficients for a digital filter;

filter the first digital signal at the digital filter using the first set of filter coefficients to generate a second digital signal;

convert the second digital signal to the second analog signal; and transmit the second analog signal at the second antenna array via directional beamforming using the second set of beamforming parameters.

* * * * *